US012417938B2

(12) United States Patent
Mori et al.

(10) Patent No.: US 12,417,938 B2
(45) Date of Patent: Sep. 16, 2025

(54) PROCESSING APPARATUS FOR INTEGRATING A SEMICONDUCTOR WAFER AND AN ANNULAR FRAME THROUGH A TAPE

(71) Applicant: DISCO CORPORATION, Tokyo (JP)

(72) Inventors: Takashi Mori, Tokyo (JP); Yoshinori Kakinuma, Tokyo (JP); Jonghyun Ryu, Tokyo (JP); Mitsuru Ikushima, Tokyo (JP); Makoto Saito, Tokyo (JP); Yohei Masuda, Tokyo (JP); Takashi Uchiho, Tokyo (JP); Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 479 days.

(21) Appl. No.: 18/047,445

(22) Filed: Oct. 18, 2022

(65) Prior Publication Data

US 2023/0121008 A1   Apr. 20, 2023

(30) Foreign Application Priority Data

Oct. 19, 2021   (JP) .................................. 2021-170673

(51) Int. Cl.
*H01L 21/683*   (2006.01)
*B23K 26/364*   (2014.01)
*H01L 21/67*   (2006.01)

(52) U.S. Cl.
CPC ........ *H01L 21/6836* (2013.01); *B23K 26/364* (2015.10); *H01L 21/67092* (2013.01);
(Continued)

(58) Field of Classification Search
CPC ....... H01L 21/6836; H01L 2221/68327; H01L 21/677; H01L 21/67742
See application file for complete search history.

(56) References Cited

U.S. PATENT DOCUMENTS

2007/0227655 A1* 10/2007 Kajiyama ........... H01L 21/3043
438/690
2007/0277934 A1* 12/2007 Kawashima ...... H01L 21/67132
156/247
(Continued)

FOREIGN PATENT DOCUMENTS

JP   2010062375 A   3/2010
JP   2013161863 A   8/2013
(Continued)

OTHER PUBLICATIONS

Uchiho, Takashi, U.S. Appl. No. 17/455,136, filed Nov. 16, 2021.
(Continued)

*Primary Examiner* — Brian Turner
(74) *Attorney, Agent, or Firm* — GREER BURNS & CRAIN, LTD.

(57) ABSTRACT

A processing apparatus includes a wafer table that supports a wafer, a frame table that supports an annular frame, a first tape pressure bonding unit that includes a first pressure bonding roller for executing pressure bonding of a tape to the annular frame, and a second tape pressure bonding unit that includes a second pressure bonding roller for executing pressure bonding of the tape of the tape-attached annular frame to a front surface or a back surface of the wafer. A first heating unit is disposed in one of or both the frame table and the first pressure bonding roller, while a second heating unit is disposed in one of or both the wafer table and the second pressure bonding roller.

14 Claims, 22 Drawing Sheets

(52) U.S. Cl.
CPC .... *H01L 21/67132* (2013.01); *H01L 21/6838* (2013.01); *H01L 2221/68327* (2013.01)

(56) References Cited

U.S. PATENT DOCUMENTS

| | | | | |
|---|---|---|---|---|
| 2008/0011412 | A1* | 1/2008 | Tsujimoto | H01L 24/29 |
| | | | | 156/193 |
| 2008/0023149 | A1* | 1/2008 | Yamamoto | H01L 21/67132 |
| | | | | 156/515 |
| 2008/0038903 | A1* | 2/2008 | Yamamoto | H01L 21/68785 |
| | | | | 438/464 |
| 2010/0055877 | A1 | 3/2010 | Kajiyama et al. | |
| 2013/0203241 | A1 | 8/2013 | Nakata et al. | |
| 2014/0073067 | A1 | 3/2014 | Uchida | |
| 2020/0083104 | A1* | 3/2020 | Harada | H01L 21/3043 |
| 2022/0189800 | A1 | 6/2022 | Uchihio et al. | |

FOREIGN PATENT DOCUMENTS

| | | | |
|---|---|---|---|
| JP | 2017005033 | A | 1/2017 |
| JP | 2019201016 | A | 11/2019 |
| JP | 2019201049 | A | 11/2019 |
| JP | 2021034492 | A | 3/2021 |

OTHER PUBLICATIONS

Office Action issued by the Patent Office of Japan in corresponding Patent Application Publication No. 2021-170673, dated Apr. 11, 2025.

* cited by examiner

PROCESSING APPARATUS FOR INTEGRATING A SEMICONDUCTOR WAFER AND AN ANNULAR FRAME THROUGH A TAPE

BACKGROUND OF THE INVENTION

Field of the Invention

The present invention relates to a processing apparatus that automatically executes work of integrating a wafer and an annular frame through a tape.

Description of the Related Art

A wafer having a device region and an outer circumferential surplus region formed on a front surface thereof, the device region being a region in which multiple devices such as integrated circuits (ICs) and large-scale integrated (LSI) circuits are formed in respective areas demarcated by multiple intersecting planned dividing lines, the outer circumferential surplus region surrounding the device region, is formed into a desired thickness by being ground on a back surface thereof. Thereafter, the wafer is divided into individual device chips by a dicing apparatus or a laser processing apparatus. The respective device chips obtained by the dividing are used for pieces of electrical equipment such as mobile phones and personal computers.

Before being processed by the dicing apparatus or the laser processing apparatus, the wafer is positioned in an opening part of an annular frame for housing the wafer therein, and is supported by the annular frame through an adhesive tape.

However, when the adhesive tape is stuck to the front surface or the back surface of the wafer, there is a fear that part of an adhesive layer remains on the wafer and lowers the quality of the device. Thus, the present assignee has proposed a wafer processing method in which a wafer is processed by being supported by an annular frame through a thermocompression bonding tape that does not have an adhesive layer (for example, thermoplastic synthetic resin tape of a polyolefin-based resin, a polyester-based resin, or the like) (for example, refer to Japanese Patent Laid-open No. 2019-201016 and Japanese Patent Laid-open No. 2019-201049). However, there is a problem that the productivity is low because integrating the wafer and the annular frame through the thermocompression bonding tape is manually executed.

Further, the present assignee has proposed the following technique. Predetermined processing is executed for a wafer in a state in which a ring-shaped reinforcing part is left in a region on a back surface of the wafer corresponding to an outer circumferential surplus region in order to make conveyance of the ground wafer easy. Thereafter, a dicing tape is stuck to the back surface of the wafer, and the wafer is supported by an annular frame. Then, the ring-shaped reinforcing part is removed from the wafer (for example, refer to Japanese Patent Laid-open No. 2010-62375).

However, there is the following problem. Specifically, it is difficult to integrate the wafer with the annular frame by sticking the tape to the back surface of the wafer on which the ring-shaped reinforcing part in a protrusion shape is formed in a region corresponding to the outer circumferential surplus region. In addition, it is difficult to cut the ring-shaped reinforcing part and remove it from the wafer. Thus, the productivity is low.

SUMMARY OF THE INVENTION

Thus, an object of the present invention is to provide a processing apparatus that can automatically execute work of integrating a wafer and an annular frame through a tape even when the wafer has a ring-shaped reinforcing part in a protrusion shape formed in a region on a back surface of the wafer corresponding to an outer circumferential surplus region.

In accordance with an aspect of the present invention, there is provided a processing apparatus including a wafer cassette table on which a wafer cassette having multiple wafers housed therein is placed, a wafer carrying-out unit that carries a wafer out from the wafer cassette placed on the wafer cassette table, a wafer table that supports the wafer carried out by the wafer carrying-out unit, and a frame housing unit that houses multiple annular frames therein, each annular frame having an opening part for housing the wafer therein. The processing apparatus also includes a frame carrying-out unit that carries the annular frame out from the frame housing unit, a frame table that supports the annular frame carried out by the frame carrying-out unit, a first tape pressure bonding unit that is disposed above the frame table and includes a first pressure bonding roller for executing pressure bonding of a tape to the annular frame, and a tape-attached frame conveying unit that conveys, to the wafer table, the annular frame to which the tape is pressure-bonded, and places the tape-attached annular frame on the wafer table in such a manner that a front surface or a back surface of the wafer supported by the wafer table is positioned in the opening part of the annular frame. The processing apparatus also includes a second tape pressure bonding unit that includes a second pressure bonding roller for executing pressure bonding of the tape of the tape-attached annular frame to the front surface or the back surface of the wafer, frame unit carrying-out means that carries, out from the wafer table, a frame unit in which the tape of the tape-attached annular frame and the front surface or the back surface of the wafer are pressure-bonded together by the second tape pressure bonding unit, and a frame cassette table on which a frame cassette that houses the frame unit therein is placed. A first heating unit is disposed in one of or both the frame table and the first pressure bonding roller, while a second heating unit is disposed in one of or both the wafer table and the second pressure bonding roller. Either an adhesive tape that has an adhesive layer laid on a sheet or a thermocompression bonding tape that does not have an adhesive layer on a sheet is selectively used as the tape.

Preferably, in the processing apparatus, a ring-shaped reinforcing part having a protrusion shape is formed in a region on the back surface corresponding to an outer circumferential surplus region of the wafer. In addition, the processing apparatus further includes a reinforcing part removing unit that cuts and removes the ring-shaped reinforcing part from the wafer of the frame unit carried out by the frame unit carrying-out means and ring-free unit carrying-out means that carries a ring-free unit resulting from the removal of the ring-shaped reinforcing part out from the reinforcing part removing unit.

Preferably, the first tape pressure bonding unit includes a roll tape support part that supports a roll tape where the tape that is yet to be used is wound, a tape take-up part that takes up the tape that has been used, a tape pull-out part that pulls out the tape from the roll tape, the first pressure bonding roller that executes pressure bonding of the tape pulled out to the annular frame, and a cutting part that cuts the tape protruding to an outer circumference of the annular frame along the annular frame.

Preferably, when the tape is a thermocompression bonding tape, the first heating unit is actuated to heat one of or both the frame table and the first pressure bonding roller and execute thermocompression bonding of the thermocompression bonding tape to the annular frame.

Preferably, the second tape pressure bonding unit includes an upper chamber disposed above the wafer table, a lower chamber in which the wafer table is housed, a raising-lowering mechanism that raises and lowers the upper chamber and generates a closed state in which the upper chamber is brought into contact with the lower chamber and an opened state in which the upper chamber is separated from the lower chamber, a vacuum part that sets the upper chamber and the lower chamber to a vacuum state in the closed state, and an opening-to-atmosphere part that opens the upper chamber and the lower chamber to atmosphere. Further, in a state in which the tape of the tape-attached annular frame is positioned to the front surface or the back surface of the wafer supported by the wafer table, the upper chamber and the lower chamber are set to a vacuum state while the closed state is kept through actuating the raising-lowering mechanism, and pressure bonding of the tape of the tape-attached annular frame to the front surface or the back surface of the wafer is executed by the second pressure bonding roller disposed in the upper chamber.

Preferably, when the tape is a thermocompression bonding tape, the second heating unit is actuated to heat one of or both the wafer table and the second pressure bonding roller and execute thermocompression bonding of the thermocompression bonding tape to the front surface or the back surface of the wafer.

Preferably, a camera is disposed in the upper chamber of the second tape pressure bonding unit, and whether an exposed surface of the wafer supported by the wafer table is the front surface or the back surface is detected before the tape-attached annular frame is conveyed.

Preferably, when the exposed surface of the wafer supported by the wafer table is the front surface, the camera acquires an identification (ID) displayed on the front surface of the wafer.

Preferably, the camera detects whether or not the tape is properly pressure-bonded to the wafer, after the pressure bonding of the tape of the tape-attached annular frame to the wafer supported by the wafer table is executed.

According to the processing apparatus of the present invention, the adhesive tape that has an adhesive layer laid on a sheet or the thermocompression bonding tape that does not have an adhesive layer on a sheet can selectively be used as the tape to be pressure-bonded to the annular frame. In addition, work of integrating the wafer and the annular frame through the tape can automatically be executed even when the wafer has the ring-shaped reinforcing part in a protrusion shape formed in a region on the back surface corresponding to the outer circumferential surplus region.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A processing apparatus of an embodiment of the present invention will be described below with reference to the drawings.

(Processing Apparatus 2)

Figure 1:
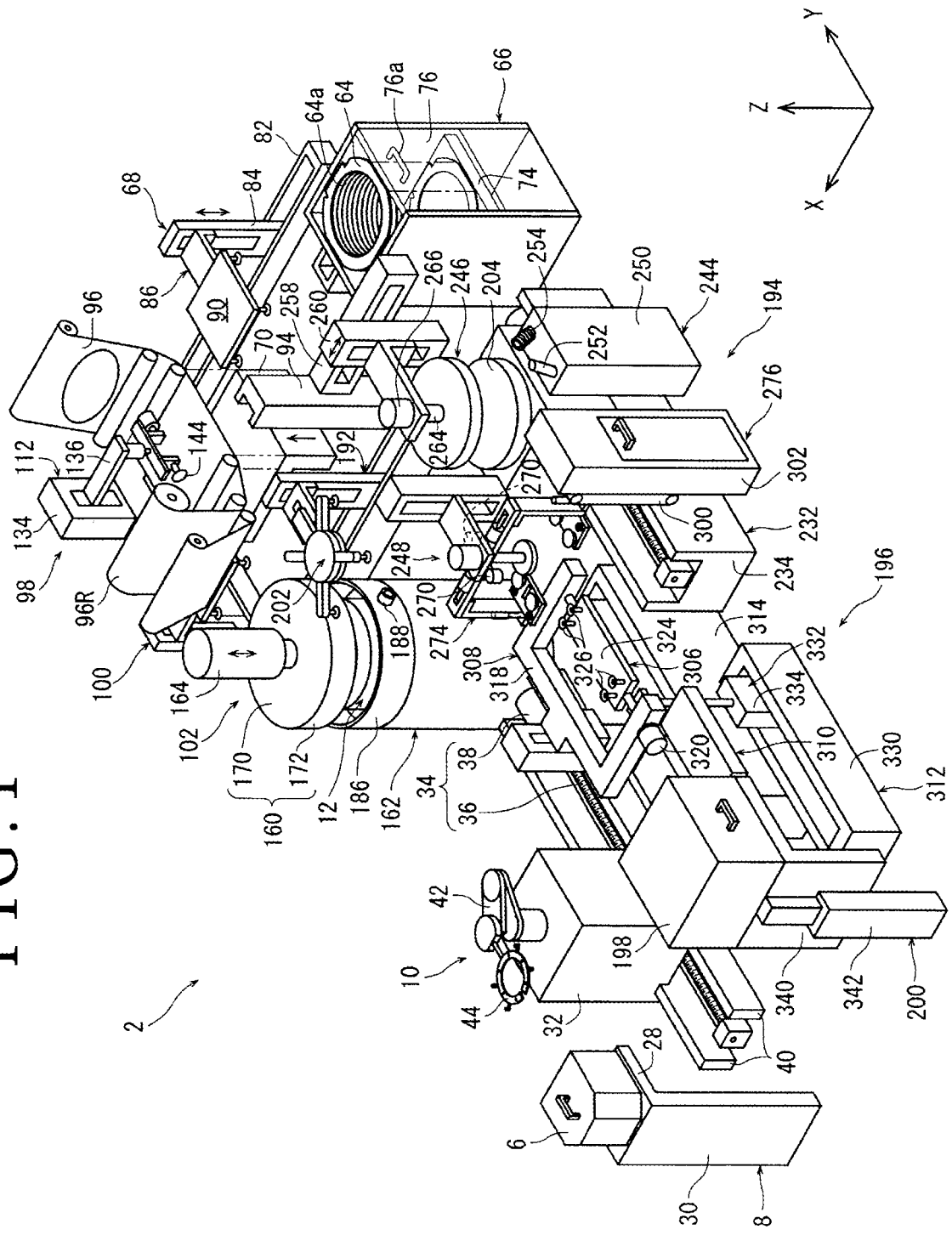
FIG. 1 is a perspective view of a processing apparatus of an embodiment of the present invention.

Referring to FIG. 1, a processing apparatus, which is denoted by numeral 2 in the entire description, includes a wafer cassette table 8 on which a wafer cassette 6 having multiple wafers housed therein is placed, a wafer carrying-out unit 10 that carries a wafer out from the wafer cassette 6 placed on the wafer cassette table 8, and a wafer table 12 that supports the wafer carried out by the wafer carrying-out unit 10.

(Wafer 4)

Figure 2A:
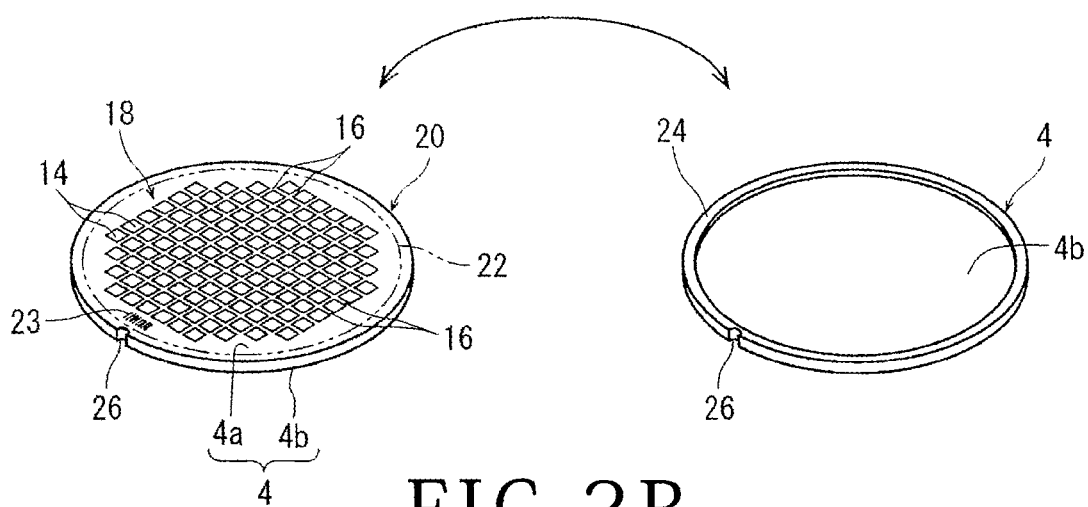
FIG. 2A is a perspective view of a wafer with a reinforcing part for which processing is executed by the processing apparatus illustrated in FIG. 1.

In FIG. 2A, a wafer 4 for which processing is executed by the processing apparatus 2 is illustrated. On a front surface 4a of the wafer 4 illustrated in FIG. 2A, a device region 18 and an outer circumferential surplus region 20 that surrounds the device region 18 are formed. The device region 18 is a region in which multiple devices 14 such as ICs and LSI circuits are formed in respective areas demarcated by planned dividing lines 16 in a lattice manner. In FIG. 2A, a boundary 22 between the device region 18 and the outer circumferential surplus region 20 is illustrated by a two-dot chain line for convenience. However, the line that indicates the boundary 22 does not exist in practice. Further, an ID 23 for identifying the wafer 4 is given to the front surface 4a of the wafer 4. The ID 23 can be configured in a form of a barcode, for example. A ring-shaped reinforcing part 24 is formed into a protrusion shape in a region on a back surface 4b of the wafer 4 corresponding to the outer circumferential surplus region 20, and the thickness of the outer circumferential surplus region 20 is thus larger than that of the device region 18. A notch 26 that indicates the crystal orientation is formed at the circumferential edge of the wafer 4.

Figure 2B:
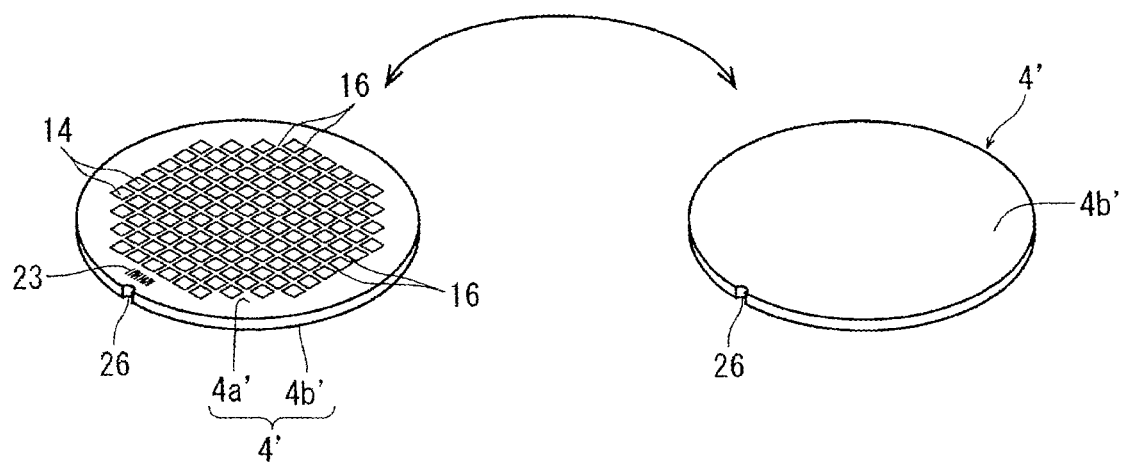
FIG. 2B is a perspective view of a wafer without the reinforcing part for which processing is executed by the processing apparatus illustrated in FIG. 1.

Moreover, the wafer for which processing is executed by the processing apparatus 2 may be a wafer 4' in which the ring-shaped reinforcing part is not made on a back surface 4b' as illustrated in FIG. 2B. In the following explanation, description will be made mainly regarding the case in which the wafer 4 having the reinforcing part 24 is processed.

(Wafer Cassette 6 and Wafer Cassette Table 8)

Figure 3:
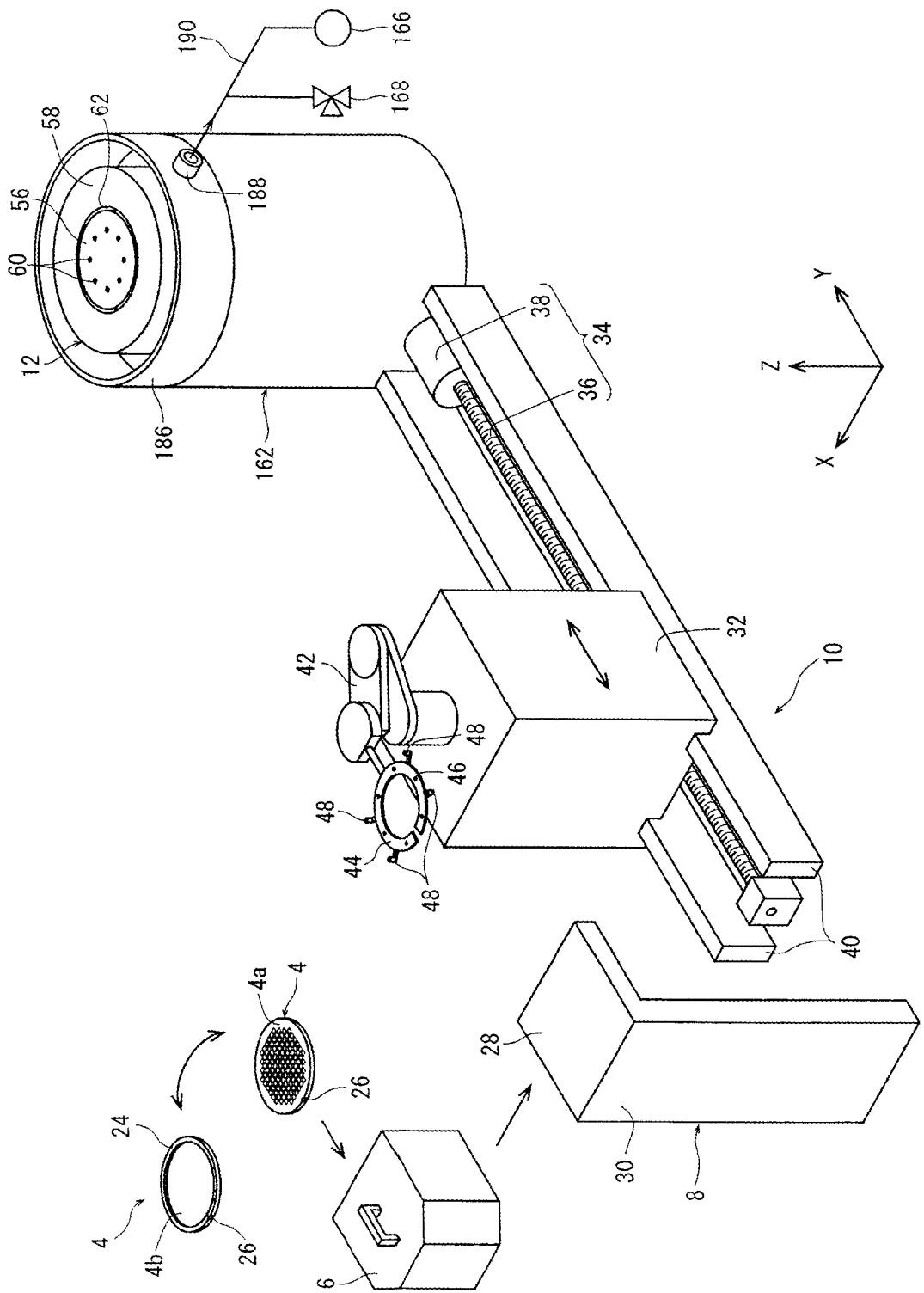
FIG. 3 is a perspective view of a wafer cassette table and so forth illustrated in FIG. 1.

As illustrated in FIG. 3, in the wafer cassette 6, multiple wafers 4 are housed at intervals in the upward-downward direction in the state in which the front surfaces 4a or the back surfaces 4b are oriented upward. The wafer cassette table 8 of the present embodiment has a top plate 28 on which the wafer cassette 6 is placed, and a support plate 30 that supports the top plate 28. The top plate 28 may be capable of rising and lowering, and raising-lowering means that raises and lowers the top plate 28 and positions it to a desired height may be disposed.

(Wafer Carrying-Out Unit 10)

The description will be continued with reference to FIG. 3. The wafer carrying-out unit 10 includes a Y-axis movable member 32 that can move in a Y-axis direction indicated by an arrow Y in FIG. 3 and a Y-axis feed mechanism 34 that moves the Y-axis movable member 32 in the Y-axis direction. The Y-axis feed mechanism 34 has a ball screw 36 that is coupled to the lower end of the Y-axis movable member 32 and that extends in the Y-axis direction and a motor 38 that rotates the ball screw 36. The Y-axis feed mechanism 34 converts rotational motion of the motor 38 to linear motion by the ball screw 36 and transmits the linear motion to the Y-axis movable member 32 to move the Y-axis movable member 32 in the Y-axis direction along a pair of guide rails 40 extending in the Y-axis direction.

An X-axis direction indicated by an arrow X in FIG. 3 is a direction orthogonal to the Y-axis direction, and a Z-axis direction indicated by an arrow Z in FIG. 3 is the upward-downward direction orthogonal to the X-axis direction and the Y-axis direction. An XY plane defined by the X-axis direction and the Y-axis direction is substantially horizontal.

As illustrated in FIG. 3, the wafer carrying-out unit 10 of the present embodiment includes a conveying arm 42 and a hand 44 that is disposed at the tip of the conveying arm 42. The hand 44 supports the front surface 4a or the back surface 4b of the wafer 4 housed in the wafer cassette 6 and inverts the front and back sides of the wafer 4. The conveying arm 42 is disposed on the upper surface of the Y-axis movable member 32 and is driven by an appropriate drive source (not illustrated) such as an air drive source or an electric drive source. This drive source drives the conveying arm 42 and moves the hand 44 to a desired position in each of the X-axis direction, the Y-axis direction, and the Z-axis direction. In addition, the drive source inverts the hand 44 upside down.

Figure 4:
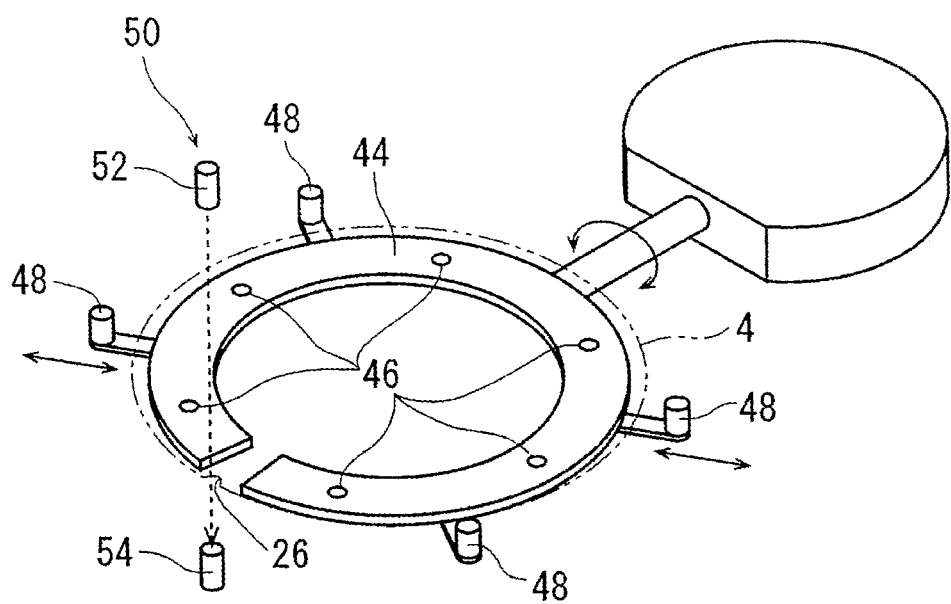
FIG. 4 is a perspective view of a hand illustrated in FIG. 1.

Referring to FIG. 4, it is preferable that the hand 44 be a Bernoulli pad that generates a negative pressure by a jet of air to support the wafer 4 in a contactless manner. The hand 44 of the present embodiment has a C-shape as a whole, and multiple air jet ports 46 connected to a compressed air supply source (not illustrated) are formed in a single surface of the hand 44. Multiple guide pins 48 are annexed to the outer circumferential edge of the hand 44 at intervals in the circumferential direction. Each guide pin 48 is configured to be movable in the radial direction of the hand 44.

As illustrated in FIG. 3 and FIG. 4, after positioning the hand 44 to the lower surface side of the wafer 4 in the wafer cassette 6 placed on the wafer cassette table 8, the wafer carrying-out unit 10 jets compressed air from the air jet ports 46 of the hand 44 to generate a negative pressure on the lower surface side of the hand 44 by the Bernoulli effect, and supports the wafer 4 under suction from the lower surface side in a contactless manner by the hand 44. Horizontal movement of the wafer 4 supported under suction by the hand 44 is restricted by the respective guide pins 48. Further, the wafer carrying-out unit 10 carries the wafer 4 supported under suction by the hand 44 out from the wafer cassette 6 by moving the Y-axis movable member 32 and the conveying arm 42.

(Notch Detecting Unit 50 of Wafer Carrying-Out Unit 10)

As illustrated in FIG. 4, the wafer carrying-out unit 10 of the present embodiment includes a notch detecting unit 50 that detects the position of the notch 26 of the wafer 4. The notch detecting unit 50 may include, for example, a light emitting element 52 and a light receiving element 54 that are spaced from each other in the upward-downward direction as well as a drive source (not illustrated) that rotates at least one of the guide pins 48 of the hand 44.

The light emitting element 52 and the light receiving element 54 can be annexed to the Y-axis movable member 32 or a conveyance route with the interposition of an appropriate bracket (not illustrated). Further, when the guide pin 48 rotates by the above-described drive source, the wafer 4 supported under suction by the hand 44 rotates together with the rotation of the guide pin 48. It is preferable that the outer circumferential surface of the guide pin 48 that rotates by the drive source be formed of appropriate synthetic rubber in order to surely transmit the rotation from the guide pin 48 to the wafer 4.

The notch detecting unit 50 can detect the position of the notch 26 by rotating the wafer 4 by the drive source through the guide pin 48 in the state in which the wafer 4 is supported under suction by the hand 44 and in which the outer circumference of the wafer 4 is positioned between the light emitting element 52 and the light receiving element 54. This makes it possible to adjust the orientation of the wafer 4 to a desired orientation.

(Wafer Table 12)

As illustrated in FIG. 3, the wafer table 12 is disposed adjacent to the wafer carrying-out unit 10. The wafer table 12 of the present embodiment includes a wafer support part 56 that supports the wafer 4 and a frame support part 58 that is disposed around the outer circumference of the wafer support part 56 and that supports an annular frame 64 (see FIG. 5) to be described later. Multiple suction holes 60 are formed in the upper surface of the wafer support part 56, and each suction hole 60 is connected to suction means (not illustrated).

When the hand 44 is inverted by 180° to invert the front and back sides of the wafer 4 and the wafer 4 is then placed on the wafer table 12, the wafer 4 is supported by the wafer support part 56. Further, after supporting the wafer 4 by the wafer support part 56, the wafer table 12 holds the wafer 4 under suction through actuating the suction means and generating a suction force for each suction hole 60.

When the wafer 4 is supported by the wafer table 12, the wafer 4 may be in either the state in which the front surface 4a of the wafer 4 is oriented downward or the state in which the back surface 4b of the wafer 4 is oriented downward. However, when the wafer 4 is supported by the wafer table 12 in the state in which the back surface 4b of the wafer 4 having the ring-shaped reinforcing part 24 thereon is oriented downward, an annular recess 62 that can house the ring-shaped reinforcing part 24 therein is made in the upper surface of the wafer table 12. In such a case, when the wafer 4 is placed on the wafer table 12, the reinforcing part 24 is housed in the annular recess 62, and a portion that is positioned inside the reinforcing part 24 on the back surface 4b of the wafer 4 comes into contact with the upper surface of the wafer table 12.

Figure 5:
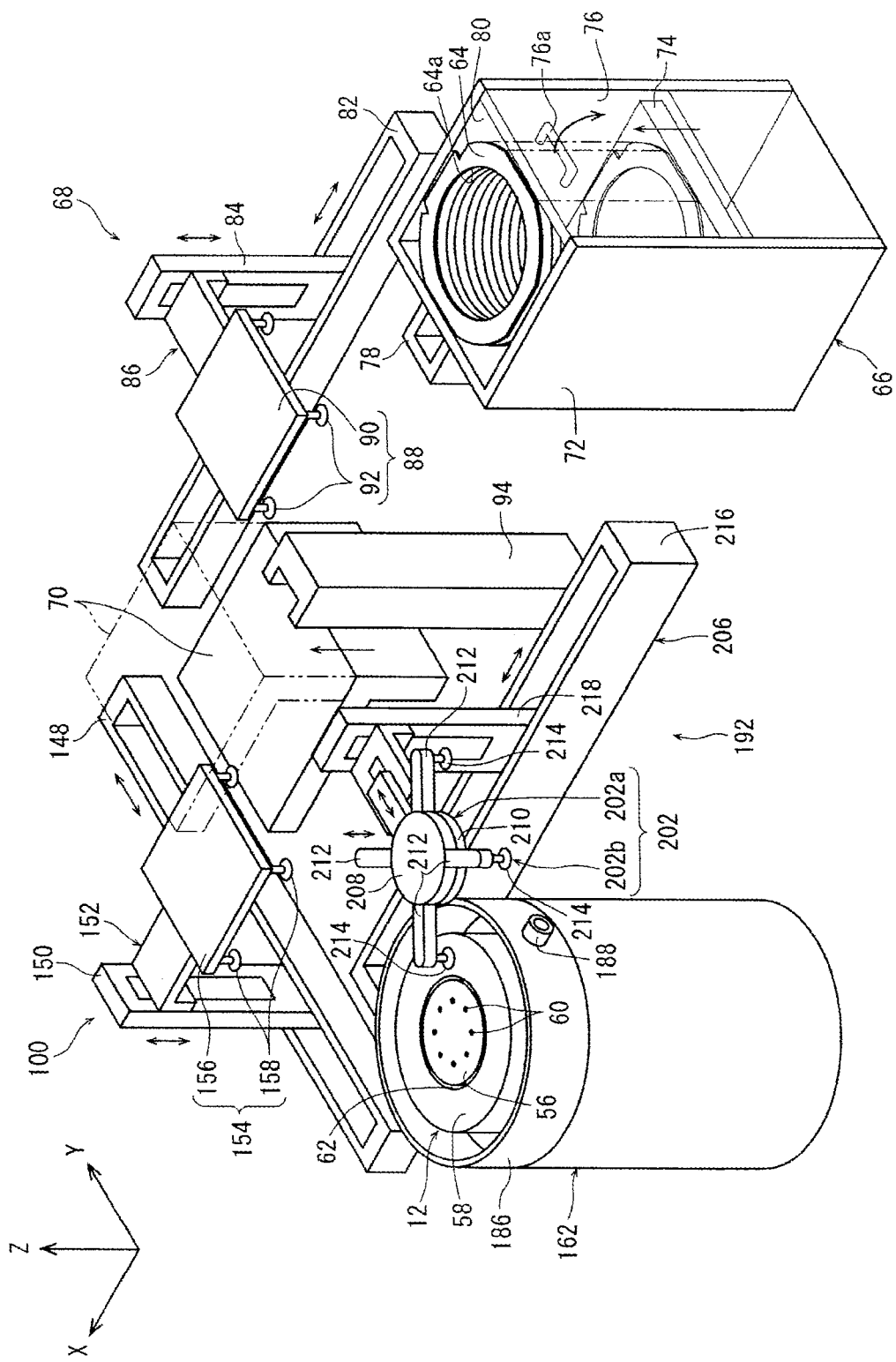
FIG. 5 is a perspective view of a frame housing unit and so forth illustrated in FIG. 1.

Referring to FIG. 5, the processing apparatus 2 further includes a frame housing unit 66 that houses multiple annular frames 64 therein, each annular frame 64 having an opening part 64a for housing the wafer 4 therein, a frame carrying-out unit 68 that carries an annular frame 64 out from the frame housing unit 66, and a frame table 70 that supports the annular frame 64 carried out by the frame carrying-out unit 68.

(Frame Housing Unit 66)

As illustrated in FIG. 5, the frame housing unit 66 of the present embodiment includes a housing 72, a rising-lowering plate 74 disposed to be capable of rising and lowering in the housing 72, and raising-lowering means (not illustrated) that raises and lowers the rising-lowering plate 74.

A Z-axis guide member 78 extending in the Z-axis direction is disposed on the side surface of the housing 72 on the far side in the X-axis direction in FIG. 5. The rising-lowering plate 74 is supported by the Z-axis guide member 78 in such a manner as to be capable of rising and lowering, and the raising-lowering means that raises and lowers the rising-lowering plate 74 is disposed inside the Z-axis guide member 78. The raising-lowering means may include, for example, a ball screw that is coupled to the rising-lowering plate 74 and that extends in the Z-axis direction and a motor that rotates this ball screw.

A door 76 to which a handle 76a is annexed is disposed at the side surface of the housing 72 on the near side in the X-axis direction in FIG. 5. In the frame housing unit 66, the annular frames 64 can be housed inside the housing 72 when the handle 76a is used to open the door 76. Further, an opening part 80 is made at the upper end of the housing 72.

As illustrated in FIG. 5, the annular frames 64 are housed in the housing 72 in such a manner as to be stacked on top of one another over the upper surface of the rising-lowering plate 74. The annular frame 64 on the top of the multiple stacked annular frames 64 is carried out from the opening part 80 of the housing 72 by the frame carrying-out unit 68. Further, when the annular frame 64 is carried out from the opening part 80, the frame housing unit 66 raises the rising-lowering plate 74 as appropriate by the raising-lowering means and moves the top annular frame 64 to the position from which this annular frame 64 can be carried out by the frame carrying-out unit 68.

(Frame Carrying-Out Unit 68)

The description will be continued with reference to FIG. 5. The frame carrying-out unit 68 includes an X-axis guide member 82 that is fixed to an appropriate bracket (not illustrated) and that extends in the X-axis direction, an X-axis movable member 84 supported by the X-axis guide member 82 movably in the X-axis direction, an X-axis feed mechanism (not illustrated) that moves the X-axis movable member 84 in the X-axis direction, a Z-axis movable member 86 supported by the X-axis movable member 84 movably in the Z-axis direction, and a Z-axis feed mechanism (not illustrated) that moves the Z-axis movable member 86 in the Z-axis direction.

The X-axis feed mechanism of the frame carrying-out unit 68 may include a ball screw that is coupled to the X-axis movable member 84 and that extends in the X-axis direction and a motor that rotates this ball screw. The Z-axis feed mechanism may include a ball screw that is coupled to the Z-axis movable member 86 and that extends in the Z-axis direction and a motor that rotates this ball screw.

The Z-axis movable member 86 of the frame carrying-out unit 68 has a holding part 88 that holds the annular frame 64. The holding part 88 of the present embodiment has a rectangular board 90 and multiple suction pads 92 disposed on a lower surface of the board 90. Each suction pad 92 is connected to suction means (not illustrated).

The frame carrying-out unit 68 holds under suction the top annular frame 64 housed in the frame housing unit 66, by the suction pads 92 of the holding part 88, and then moves the X-axis movable member 84 and the Z-axis movable member 86. Thus, the frame carrying-out unit 68 carries the top annular frame 64, which is held under suction, out from the frame housing unit 66.

(Frame Table 70)

As illustrated in FIG. 5, the frame table 70 is supported by a Z-axis guide member 94 in such a manner as to be capable of rising and lowering. An appropriate drive source (for example, air drive source or electric drive source) that raises and lowers the frame table 70 is annexed to the Z-axis guide member 94.

As illustrated in FIG. 1 and FIG. 5, the processing apparatus 2 includes a first tape pressure bonding unit 98 (see FIG. 1) that is disposed above the frame table 70 and that includes a first pressure bonding roller 110 for executing pressure bonding of a tape 96 to the annular frame 64, and a tape-attached frame conveying unit 100 (see FIG. 5) that conveys the annular frame 64 to which the tape 96 is pressure-bonded (hereinafter, often referred to as a "tape-attached annular frame 64'") to the wafer table 12 and that places the tape-attached annular frame 64' on the wafer table 12 in such a manner that the front surface 4a or the back surface 4b of the wafer 4 supported by the wafer table 12 is positioned in the opening part 64a of the annular frame 64. The processing apparatus 2 further includes a second tape pressure bonding unit 102 (see FIG. 1) that includes a second pressure bonding roller 174 for executing pressure bonding of the tape 96 of the tape-attached annular frame 64' to the front surface 4a or the back surface 4b of the wafer 4.
(First Tape Pressure Bonding Unit 98)

Figure 6:
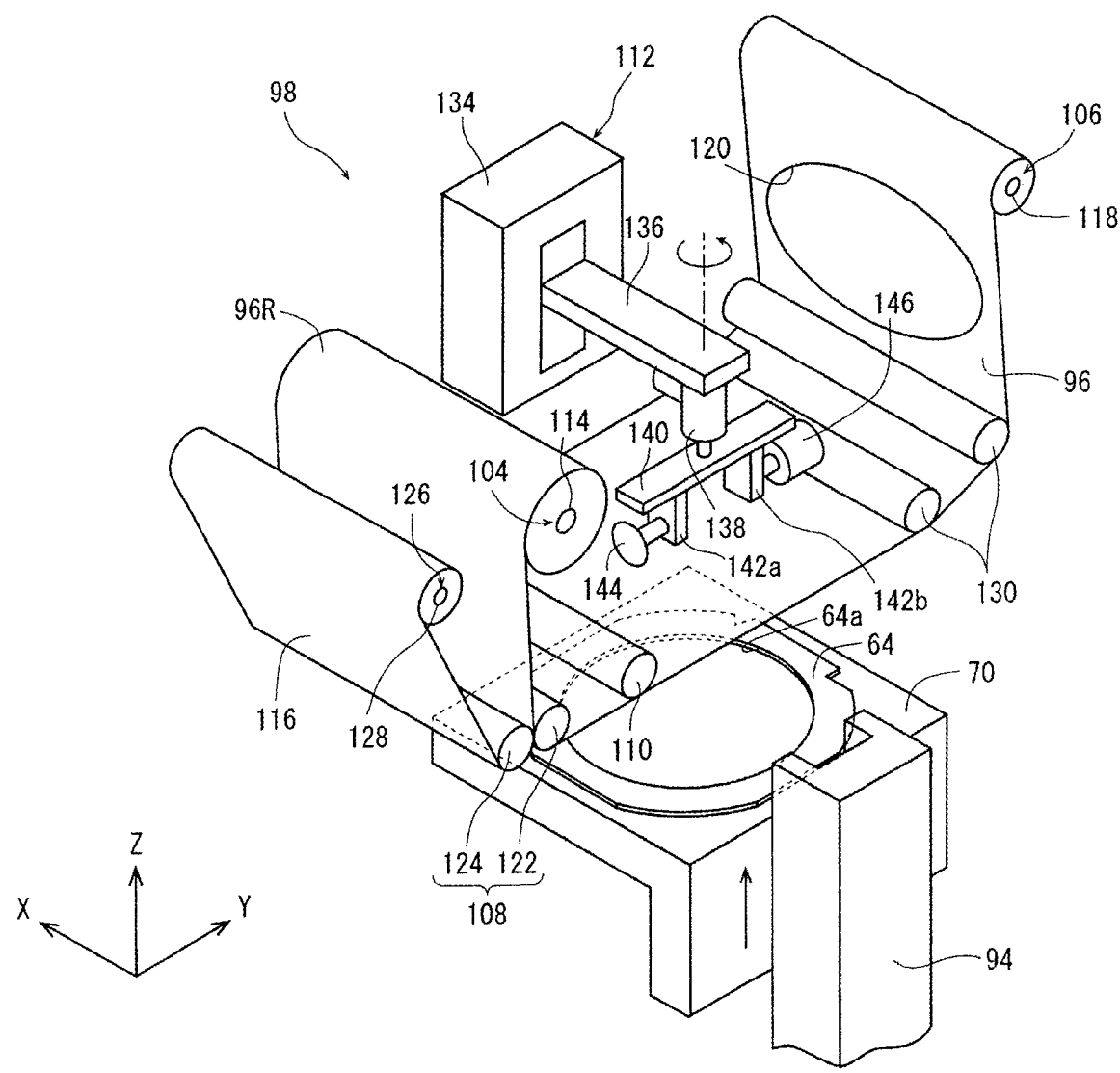
FIG. 6 is a perspective view of a frame table, a first tape pressure bonding unit, and so forth illustrated in FIG. 1.

Referring to FIG. 6, the first tape pressure bonding unit 98 of the present embodiment includes a roll tape support part 104 that supports a roll tape 96R where the tape 96 that is yet to be used is wound, a tape take-up part 106 that takes up the tape 96 that has been used, a tape pull-out part 108 that pulls out the tape 96 from the roll tape 96R, the first pressure bonding roller 110 that executes pressure bonding of the pulled-out tape 96 to the annular frame 64, and a cutting part 112 that cuts the tape 96 protruding to the outer circumference of the annular frame 64 along the annular frame 64.
(Roll Tape Support Part 104 of First Tape Pressure Bonding Unit 98)

As illustrated in FIG. 6, the roll tape support part 104 includes a support roller 114 supported by an appropriate bracket (not illustrated) rotatably around an axis line extending in the X-axis direction. The roll tape 96R where the tape 96 having a pressure bonding surface to which release paper 116 for protecting the pressure bonding surface of the tape 96 is annexed is wound in a circular cylindrical form is supported by the support roller 114.
(Tape Take-Up Part 106 of First Tape Pressure Bonding Unit 98)

The tape take-up part 106 includes a take-up roller 118 supported by an appropriate bracket (not illustrated) rotatably around an axis line extending in the X-axis direction and a motor (not illustrated) that rotates the take-up roller 118. As illustrated in FIG. 6, the tape take-up part 106 takes up the used tape 96 in which a circular opening part 120 corresponding to a portion stuck to the annular frame 64 is formed, by rotating the take-up roller 118 by the motor.
(Tape Pull-Out Part 108 of First Tape Pressure Bonding Unit 98)

The description will be continued with reference to FIG. 6. The tape pull-out part 108 includes a pull-out roller 122 disposed below the support roller 114 of the roll tape support part 104, a motor (not illustrated) that rotates the pull-out roller 122, and a driven roller 124 that rotates together with the rotation of the pull-out roller 122. The tape pull-out part 108 pulls out the tape 96 sandwiched between the pull-out roller 122 and the driven roller 124 from the roll tape 96R by rotating the driven roller 124 together with the pull-out roller 122 by the motor.

The release paper 116 is separated from the tape 96 that has passed between the pull-out roller 122 and the driven roller 124, and the separated release paper 116 is taken up by a release paper take-up part 126. The release paper take-up part 126 of the present embodiment has a release paper take-up roller 128 disposed above the driven roller 124 and a motor (not illustrated) that rotates the release paper take-up roller 128. Further, the tape 96 from which the release paper 116 has been separated goes through a pair of guide rollers 130 spaced from the pull-out roller 122 in the Y-axis direction and is guided to the take-up roller 118.
(First Pressure Bonding Roller 110 of First Tape Pressure Bonding Unit 98)

Figure 7:
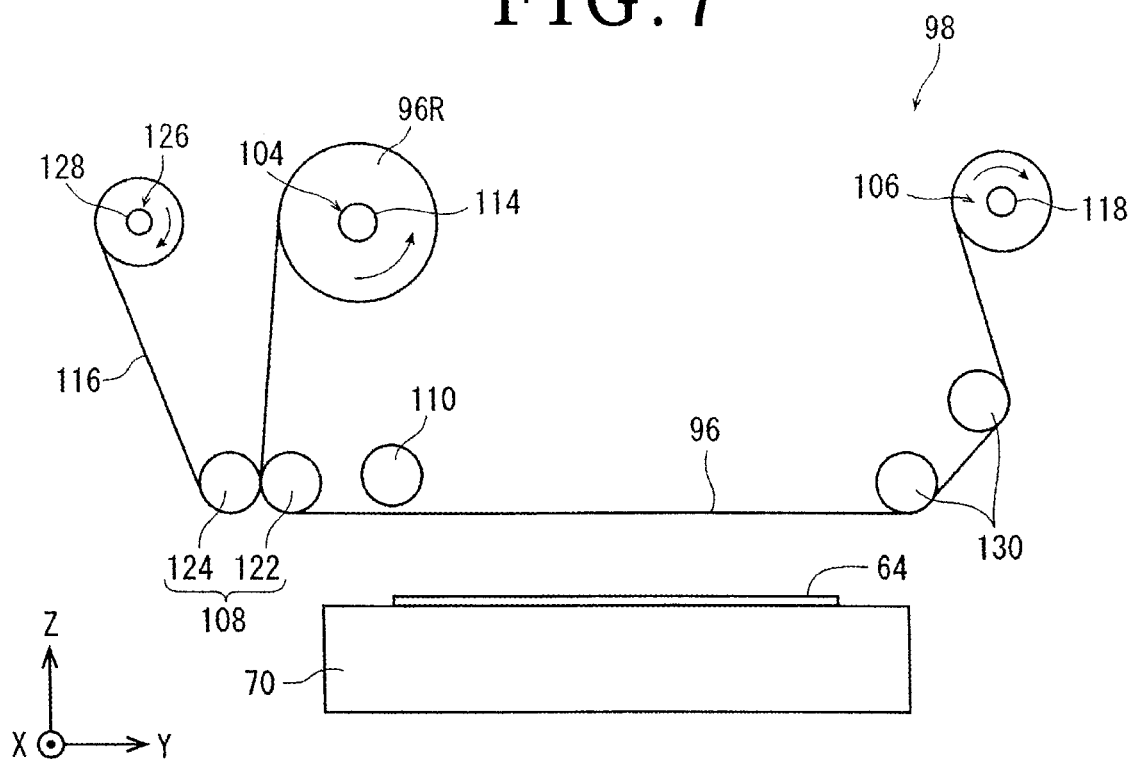
FIG. 7 is a schematic diagram of the first tape pressure bonding unit illustrated in FIG. 1.
Figure 8:
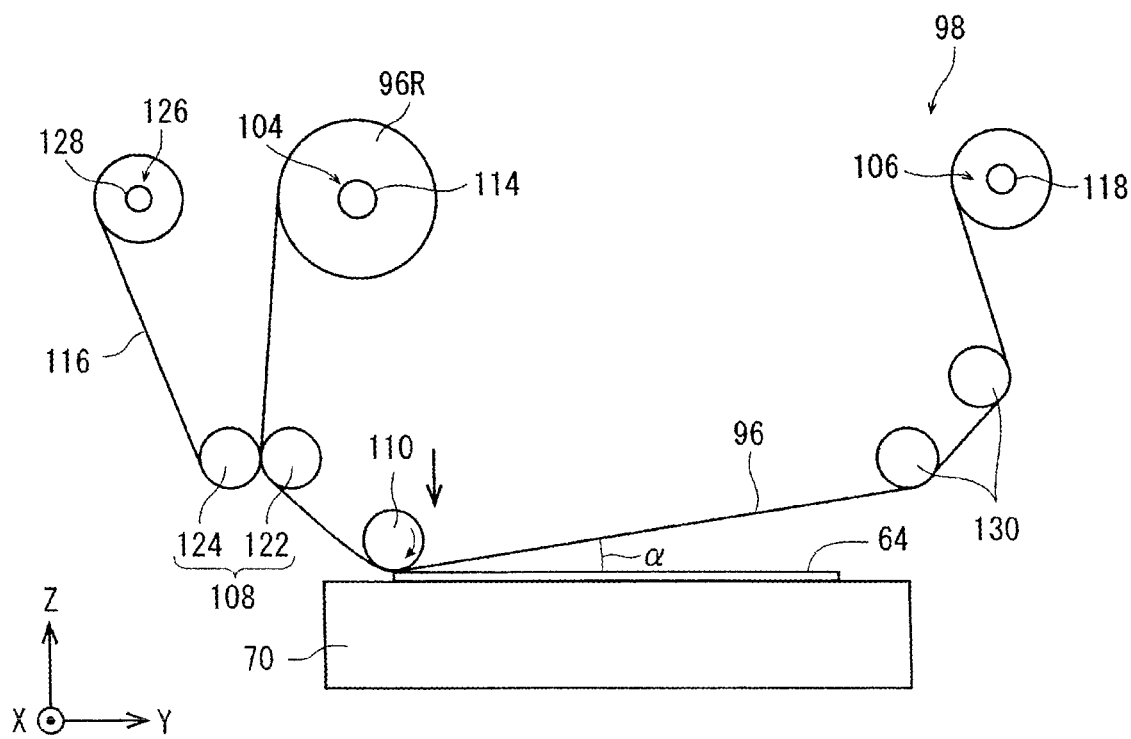
FIG. 8 is a schematic diagram illustrating the state in which a first pressure bonding roller is moved to a pressure bonding position and a tape is pressure-bonded to one end of an annular frame.

Referring to FIG. 7 and FIG. 8, the first pressure bonding roller 110 is raised and lowered by a Z-axis feed mechanism (not illustrated) and is moved to an upper-side standby position illustrated in FIG. 7 and a lower-side pressure bonding position illustrated in FIG. 8. Moreover, the first pressure bonding roller 110 is moved in the Y-axis direction by a Y-axis feed mechanism, which is not illustrated in the diagram, in the state of being at the lower-side pressure bonding position. The Y-axis feed mechanism and the Z-axis feed mechanism can include an appropriate drive source (for example, air drive source or electric drive source).
(Cutting Part 112 of First Tape Pressure Bonding Unit 98)

As illustrated in FIG. 6, the cutting part 112 includes a Z-axis guide member 134 that is fixed to an appropriate bracket (not illustrated) and that extends in the Z-axis direction, a Z-axis movable member 136 supported by the Z-axis guide member 134 movably in the Z-axis direction, and a Z-axis feed mechanism (not illustrated) that moves the Z-axis movable member 136 in the Z-axis direction. The Z-axis feed mechanism of the cutting part 112 may include a ball screw that is coupled to the Z-axis movable member 136 and that extends in the Z-axis direction and a motor that rotates this ball screw.

Further, the cutting part 112 includes a motor 138 fixed to the lower surface of the tip of the Z-axis movable member 136 and an arm piece 140 rotated by the motor 138 around an axis line extending in the Z-axis direction. To the lower surface of the arm piece 140, first and second drooping pieces 142a and 142b spaced from each other are annexed. A circular cutter 144 is supported by the first drooping piece 142a rotatably around an axis line orthogonal to the Z-axis direction. A holding-down roller 146 is supported by the second drooping piece 142b rotatably around an axis line orthogonal to the Z-axis direction.
(Tape 96)

The tape 96 may be an adhesive tape that has an adhesive layer (glue layer) laid on a single surface of a sheet, or may be a thermocompression bonding tape that does not have an adhesive layer laid on a sheet. The thermocompression bonding tape is a tape of a thermoplastic synthetic resin (for example, polyolefin-based resin) and is a tape that softens or melts to exert an adhesive force when being heated to a temperature near the melting point.

The pressure bonding surface (adhesive surface) of the adhesive tape is given the release paper 116, whereas the pressure bonding surface of the thermocompression bonding tape is given the release paper 116 in some cases and is not given the release paper 116 in other cases. When the thermocompression bonding tape that is not given the release paper 116 is used, the first tape pressure bonding unit 98 does not need to include the release paper take-up part 126 because there is no need to collect the release paper 116.

In the case in which the tape 96 is the thermocompression bonding tape, a first heating unit (not illustrated) is disposed in one of or both the frame table 70 and the first pressure bonding roller 110, and one of or both the frame table 70 and the first pressure bonding roller 110 are heated to a temperature near the melting point of the thermocompression bonding tape when pressure bonding of the thermocompression bonding tape to the annular frame 64 is executed.

When pressure bonding of the tape 96 to the annular frame 64 is executed by the first tape pressure bonding unit 98, before the annular frame 64 is placed on the frame table 70, the frame table 70 is first lowered to a position at which the frame table 70 can receive the annular frame 64 (for example, position illustrated in FIG. 6). In addition, the first pressure bonding roller 110 is moved to the upper-side standby position (for example, position illustrated in FIG. 6).

Further, the tape 96 is pulled out from the roll tape 96R, and the tape 96 from which the release paper 116 has been separated is positioned above the frame table 70 in the state in which the tape 96 is stretched tight without being slacked. When the tape 96 is an adhesive tape, the pressure bonding surface (adhesive surface) of the tape 96 located above the frame table 70 is oriented downward.

Subsequently, when the annular frame 64 is carried out by the frame carrying-out unit 68 and placed on the frame table 70, the frame table 70 is moved to a pressure bonding start position (position illustrated in FIG. 8). In addition, the first pressure bonding roller 110 is moved to the lower-side pressure bonding position (position illustrated in FIG. 8), and tension is applied to the tape 96, so that pressure bonding of the tape 96 to one end of the annular frame 64 is executed.

Next, the first pressure bonding roller 110 is moved in the Y-axis direction toward the other end of the annular frame 64 while the tape 96 is pressed against the annular frame 64 by the first pressure bonding roller 110. Thus, pressure bonding of the tape 96 to the annular frame 64 is executed in the state in which uniform tension is applied to the tape 96.

After the tape 96 is pressure-bonded to the annular frame 64, the first tape pressure bonding unit 98 lowers the Z-axis movable member 136 of the cutting part 112 by the Z-axis feed mechanism to press the cutter 144 against the tape 96 on the annular frame 64 and hold down the annular frame 64 by the holding-down roller 146 from over the tape 96.

Subsequently, the first tape pressure bonding unit 98 rotates the arm piece 140 by the motor 138 and causes the cutter 144 and the holding-down roller 146 to move to draw a circle along the annular frame 64. This can cut the tape 96 protruding to the outer circumference of the annular frame 64 along the annular frame 64.

Further, because the annular frame 64 is held down by the holding-down roller 146 from over the tape 96, deviation of the positions of the annular frame 64 and the tape 96 is prevented when the tape 96 is being cut. Then, after the frame table 70 is lowered, the used tape 96 in which the circular opening part 120 corresponding to a portion stuck to the annular frame 64 is formed is taken up by the tape take-up part 106.

(Tape-Attached Frame Conveying Unit 100)

As illustrated in FIG. 5, the tape-attached frame conveying unit 100 includes a Y-axis guide member 148 that is fixed to an appropriate bracket (not illustrated) and that extends in the Y-axis direction, a Y-axis movable member 150 supported by the Y-axis guide member 148 movably in the Y-axis direction, a Y-axis feed mechanism (not illustrated) that moves the Y-axis movable member 150 in the Y-axis direction, a Z-axis movable member 152 supported by the Y-axis movable member 150 movably in the Z-axis direction, and a Z-axis feed mechanism (not illustrated) that moves the Z-axis movable member 152 in the Z-axis direction.

The Y-axis feed mechanism of the tape-attached frame conveying unit 100 may include a ball screw that is coupled to the Y-axis movable member 150 and that extends in the Y-axis direction and a motor that rotates this ball screw. The Z-axis feed mechanism may include a ball screw that is coupled to the Z-axis movable member 152 and that extends in the Z-axis direction and a motor that rotates this ball screw.

The Z-axis movable member 152 of the tape-attached frame conveying unit 100 has a holding part 154 that holds the tape-attached annular frame 64'. The holding part 154 of the present embodiment has a rectangular board 156 and multiple suction pads 158 disposed on the lower surface of the board 156. Each suction pad 158 is connected to suction means (not illustrated).

The tape-attached frame conveying unit 100 holds under suction the upper surface of the tape-attached annular frame 64' supported by the frame table 70, by the respective suction pads 158 of the holding part 154, and moves the Y-axis movable member 150 and the Z-axis movable member 152. Thus, the tape-attached frame conveying unit 100 conveys the tape-attached annular frame 64' held under suction by the holding part 154 from the frame table 70 to the wafer table 12, and places the tape-attached annular frame 64' on the wafer table 12 in such a manner that the front surface 4a or the back surface 4b of the wafer 4 supported by the wafer table 12 is positioned in the opening part 64a of the annular frame 64.

(Second Tape Pressure Bonding Unit 102)

Figure 11:
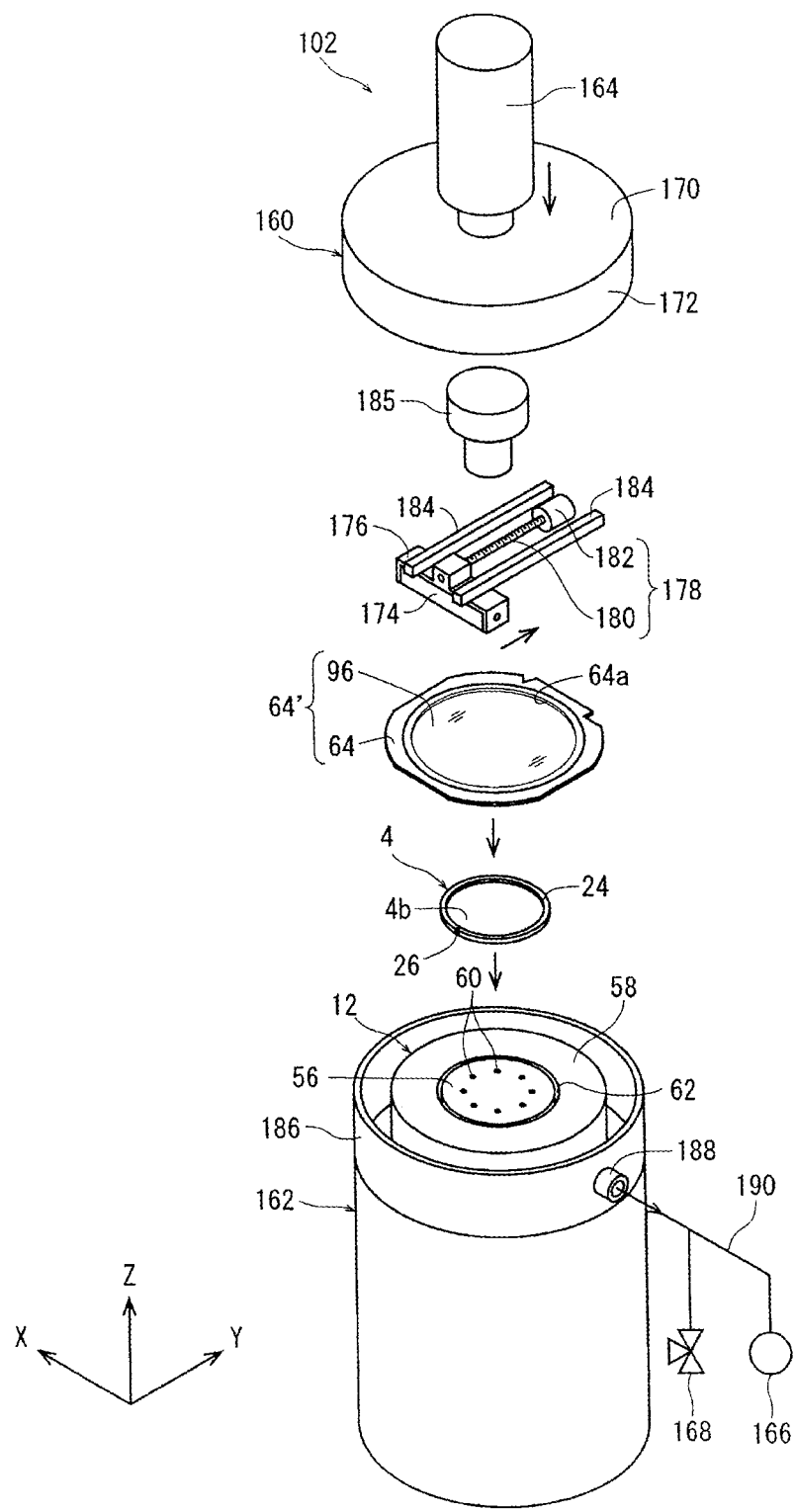
FIG. 11 is an exploded perspective view of a second tape pressure bonding unit illustrated in FIG. 1.

As illustrated in FIG. 11, the second tape pressure bonding unit 102 includes an upper chamber 160 disposed above the wafer table 12, a lower chamber 162 in which the wafer table 12 is housed, and a raising-lowering mechanism 164 that raises and lowers the upper chamber 160 and that generates a closed state in which the upper chamber 160 is brought into contact with the lower chamber 162 and an opened state in which the upper chamber 160 is separated from the lower chamber 162. The second tape pressure bonding unit 102 further includes a vacuum part 166 that sets the upper chamber 160 and the lower chamber 162 to a vacuum state in the closed state and an opening-to-atmosphere part 168 that opens the upper chamber 160 and the lower chamber 162 to the atmosphere.

(Upper Chamber 160 and Raising-Lowering Mechanism 164 of Second Tape Pressure Bonding Unit 102)

As illustrated in FIG. 11, the upper chamber 160 of the present embodiment includes a circular top plate 170 and a circular cylindrical sidewall 172 that droops from the circumferential edge of the top plate 170. The raising-lowering mechanism 164 that can include an appropriate actuator such as an air cylinder is mounted on the upper surface of the top plate 170. In a housing space defined by the lower surface of the top plate 170 and the inner circumferential surface of the sidewall 172, the second pressure bonding roller 174 for pressure bonding of the tape 96 of the tape-attached annular frame 64' to the front surface 4a or the back surface 4b of the wafer 4 supported by the wafer table 12, a support piece 176 that rotatably supports the second pressure bonding roller 174, and a Y-axis feed mechanism 178 that moves the support piece 176 in the Y-axis direction are disposed.

The Y-axis feed mechanism 178 has a ball screw 180 that is coupled to the support piece 176 and that extends in the Y-axis direction and a motor 182 that rotates the ball screw

180. Further, the Y-axis feed mechanism 178 converts rotational motion of the motor 182 to linear motion by the ball screw 180 and transmits the linear motion to the support piece 176 to move the support piece 176 along a pair of guide rails 184 extending in the Y-axis direction.

As illustrated in FIG. 11, a camera 185 that images the wafer 4 supported by the wafer table 12 is disposed in the upper chamber 160. The camera 185 images the wafer 4 on the wafer table 12 and detects whether the exposed surface (upper surface) of the wafer 4 is the front surface 4a or the back surface 4b. Further, the camera 185 acquires the ID 23 displayed on the front surface 4a of the wafer 4, when the exposed surface (upper surface) of the wafer 4 supported by the wafer table 12 is the front surface 4a. Moreover, after the tape 96 of the tape-attached annular frame 64' is pressure-bonded to the wafer 4 supported by the wafer table 12, the camera 185 detects whether or not the tape 96 is properly pressure-bonded to the wafer 4.

(Lower Chamber 162, Vacuum Part 166, and Opening-to-Atmosphere Part 168 of Second Tape Pressure Bonding Unit 102)

As illustrated in FIG. 11, the lower chamber 162 has a circular cylindrical sidewall 186. The upper part of the sidewall 186 is opened, and the lower part of the sidewall 186 is closed. A connection opening 188 is formed in the sidewall 186. The vacuum part 166 that can include an appropriate vacuum pump is connected to the connection opening 188 through a flow path 190. The opening-to-atmosphere part 168 that can include an appropriate valve capable of opening the flow path 190 to the atmosphere is disposed on the flow path 190.

In the state in which the tape 96 of the tape-attached annular frame 64' is positioned to the front surface 4a or the back surface 4b of the wafer 4 supported by the wafer table 12, the second tape pressure bonding unit 102 lowers the upper chamber 160 by the raising-lowering mechanism 164 and brings the lower end of the sidewall 172 of the upper chamber 160 into contact with the upper end of the sidewall 186 of the lower chamber 162 to set the upper chamber 160 and the lower chamber 162 to the closed state. In addition, the second tape pressure bonding unit 102 brings the second pressure bonding roller 174 into contact with the tape-attached annular frame 64'.

Subsequently, the second tape pressure bonding unit 102 actuates the vacuum pump that configures the vacuum part 166, in the state in which the valve that configures the opening-to-atmosphere part 168 is closed, to set the inside of the upper chamber 160 and the lower chamber 162 to a vacuum state. Thereafter, the second tape pressure bonding unit 102 rolls the second pressure bonding roller 174 in the Y-axis direction by the Y-axis feed mechanism 178, to thereby execute pressure bonding of the tape 96 to the front surface 4a or the back surface 4b of the wafer 4 and generate a frame unit U.

When the tape 96 is pressure-bonded to the back surface 4b of the wafer 4 having the reinforcing part 24, a slight gap is formed between the wafer 4 and the tape 96 at the root of the ring-shaped reinforcing part 24. However, because the pressure bonding of the wafer 4 and the tape 96 is executed in the state in which the inside of the upper chamber 160 and the lower chamber 162 is set to the vacuum state, the pressure of the slight gap between the wafer 4 and the tape 96 is lower than the atmospheric pressure. Thus, when the opening-to-atmosphere part 168 is opened after the tape 96 is pressure-bonded, the tape 96 is pressed against the wafer 4 by the atmospheric pressure. With this, the gap between the wafer 4 and the tape 96 at the root of the reinforcing part 24 disappears, and the tape 96 comes into close contact with the back surface 4b of the wafer 4 along the root of the reinforcing part 24.

In the case in which the tape 96 is the thermocompression bonding tape, a second heating unit (not illustrated) is disposed in one of or both the wafer table 12 and the second pressure bonding roller 174, and one of or both the wafer table 12 and the second pressure bonding roller 174 are heated to a temperature near the melting point of the thermocompression bonding tape when pressure bonding of the tape 96 of the tape-attached annular frame 64' to the wafer 4 is executed.

Figure 14:
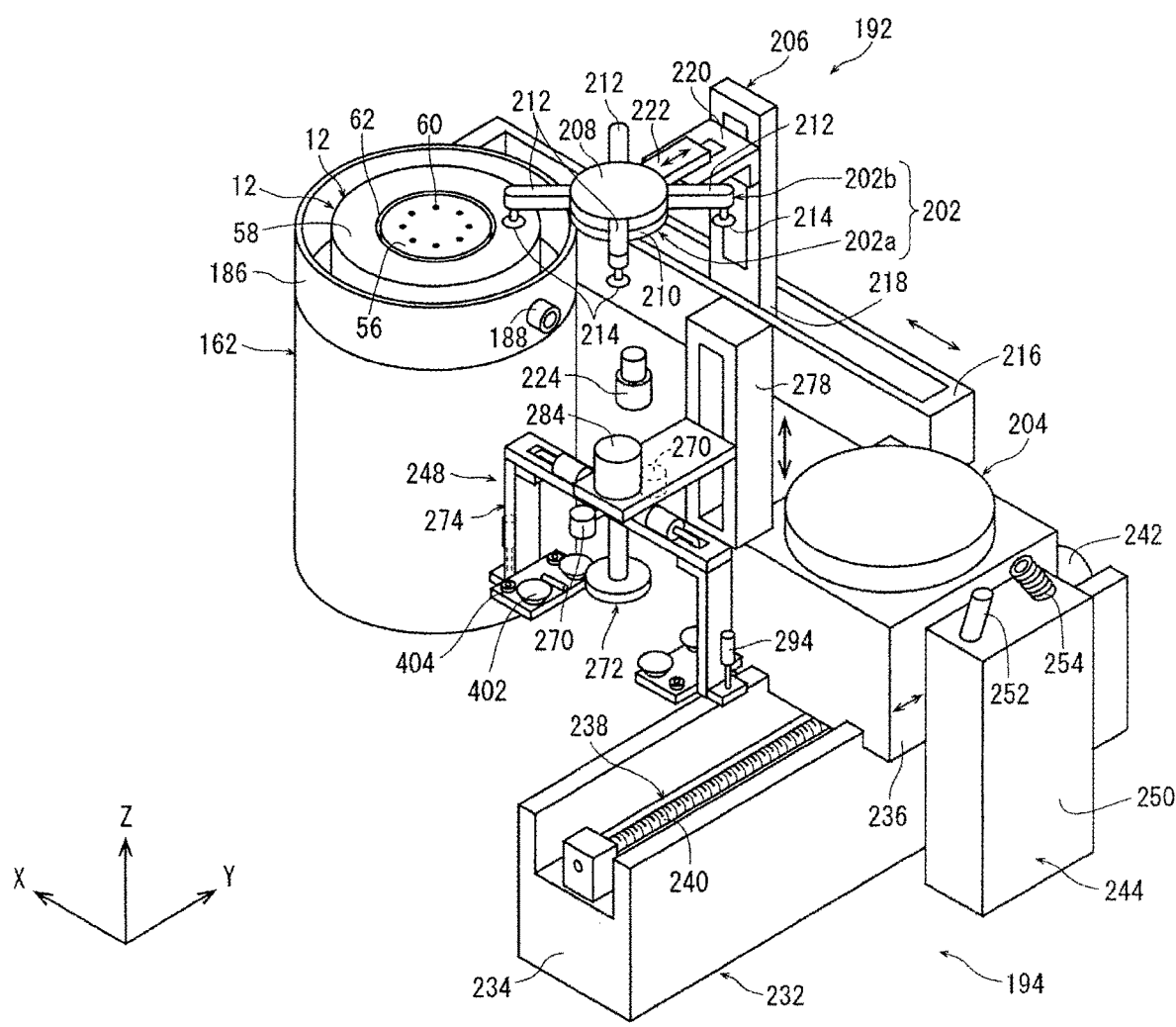
FIG. 14 is a perspective view of a reinforcing part removing unit illustrated in FIG. 1.

As illustrated in FIG. 1 and FIG. 14, the processing apparatus 2 of the present embodiment further includes frame unit carrying-out means 192 that carries, out from the wafer table 12, the frame unit U in which the tape 96 of the tape-attached annular frame 64' and the front surface 4a or the back surface 4b of the wafer 4 are pressure-bonded together by the second tape pressure bonding unit 102, and a reinforcing part removing unit 194 that cuts and removes the ring-shaped reinforcing part 24 from the wafer 4 of the frame unit U carried out by the frame unit carrying-out means 192. The processing apparatus 2 also includes ring-free unit carrying-out means 196 (see FIG. 1) that carries a ring-free unit resulting from the removal of the ring-shaped reinforcing part 24 out from the reinforcing part removing unit 194, and a frame cassette table 200 (see FIG. 1) on which a frame cassette 198 that houses the ring-free unit carried out by the ring-free unit carrying-out means 196 is placed.

(Frame Unit Carrying-Out Means 192)

As illustrated in FIG. 14, the frame unit carrying-out means 192 of the present embodiment includes a frame unit holding part 202 including a wafer holding part 202a that holds the wafer 4 and a frame holding part 202b that holds the annular frame 64, and a conveying part 206 that conveys the frame unit holding part 202 to a temporary placement table 204.

(Frame Unit Holding Part 202 of Frame Unit Carrying-Out Means 192)

The wafer holding part 202a of the frame unit holding part 202 includes a circular board 208 and a circular suction adhesion piece 210 mounted on the lower surface of the board 208. Multiple suction holes (not illustrated) are formed in the lower surface of the suction adhesion piece 210, and each suction hole is connected to suction means (not illustrated). The frame holding part 202b includes multiple (in the present embodiment, four) protruding pieces 212 that protrude outward in the radial direction from the circumferential edge of the board 208 of the wafer holding part 202a and that are arranged at intervals in the circumferential direction, and suction pads 214 annexed to the lower surfaces of the protruding pieces 212. Each suction pad 214 is connected to the suction means (not illustrated).

(Conveying Part 206 of Frame Unit Carrying-Out Means 192)

The conveying part 206 includes an X-axis guide member 216 that is fixed to an appropriate bracket (not illustrated) and that extends in the X-axis direction, an X-axis movable member 218 supported by the X-axis guide member 216 movably in the X-axis direction, and an X-axis feed mechanism (not illustrated) that moves the X-axis movable member 218 in the X-axis direction. The conveying part 206 further includes a Z-axis movable member 220 supported by the X-axis movable member 218 movably in the Z-axis direction, a Z-axis feed mechanism (not illustrated) that moves the Z-axis movable member 220 in the Z-axis direction, a Y-axis movable member 222 supported by the Z-axis movable member 220 movably in the Y-axis direction, and a Y-axis feed mechanism (not illustrated) that moves the Y-axis movable member 222 in the Y-axis direction. The board 208 of the wafer holding part 202a is coupled to the tip of the Y-axis movable member 222. Each of the X-axis, Y-axis, and Z-axis feed mechanisms of the conveying part 206 may include a ball screw and a motor that rotates the ball screw.

It is preferable for the frame unit carrying-out means 192 to include a two-dimensional movement mechanism that two-dimensionally moves the frame unit holding part 202 in the horizontal direction and an imaging part 224 that images the outer circumference of the wafer 4 of the frame unit U held by the frame unit holding part 202. In the present embodiment, the frame unit holding part 202 two-dimensionally moves in the horizontal direction in the XY plane by the X-axis feed mechanism and the Y-axis feed mechanism of the conveying part 206, and the two-dimensional movement mechanism is configured by the conveying part 206. Further, the imaging part 224 of the present embodiment is disposed between the wafer table 12 and the temporary placement table 204 and images the outer circumference of the wafer 4 of the frame unit U held by the frame unit holding part 202 from the lower side of the wafer 4.

The frame unit carrying-out means 192 carries the frame unit U held by the frame unit holding part 202 out from the wafer table 12 by actuating the conveying part 206 in the state in which the wafer 4 is held under suction by the suction adhesion piece 210 of the wafer holding part 202a and in which the annular frame 64 is held under suction by the suction pads 214 of the frame holding part 202b.

Further, the frame unit carrying-out means 192 of the present embodiment measures the coordinates of at least three points at the outer circumference of the wafer 4 by actuating the conveying part 206, which configures the two-dimensional movement mechanism, and imaging, by the imaging part 224, at least three places at the outer circumference of the wafer 4 of the frame unit U held by the frame unit holding part 202, and obtains the center coordinates of the wafer 4 on the basis of the measured coordinates of the three points. Then, the frame unit carrying-out means 192 makes the center of the wafer 4 correspond with the center of the temporary placement table 204 and temporarily places the frame unit U on the temporary placement table 204.

(Temporary Placement Table 204)

As illustrated in FIG. 14, the temporary placement table 204 is spaced from the wafer table 12 in the X-axis direction. It is preferable that the temporary placement table 204 include a heater (not illustrated), that the tape 96 of the frame unit U temporarily placed on the temporary placement table 204 be softened by being heated by the heater, and that the tape 96 be brought into closer contact with the root of the ring-shaped reinforcing part 24 by the atmospheric pressure.

(Temporary Placement Table Conveying Part 232)

The processing apparatus 2 of the present embodiment includes a temporary placement table conveying part 232 that conveys the temporary placement table 204 in the Y-axis direction. The temporary placement table conveying part 232 includes a Y-axis guide member 234 extending in the Y-axis direction, a Y-axis movable member 236 supported by the Y-axis guide member 234 movably in the Y-axis direction, and a Y-axis feed mechanism 238 that moves the Y-axis movable member 236 in the Y-axis direction. The temporary placement table 204 is fixed to the upper part of the Y-axis movable member 236. The Y-axis feed mechanism 238 has a ball screw 240 that is coupled to the Y-axis movable member 236 and that extends in the Y-axis direction and a motor 242 that rotates the ball screw 240. Further, the temporary placement table conveying part 232 converts rotational motion of the motor 242 to linear motion by the ball screw 240 and transmits the linear motion to the Y-axis movable member 236 to convey the temporary placement table 204 in the Y-axis direction together with the Y-axis movable member 236.

(Reinforcing Part Removing Unit 194)

As illustrated in FIG. 1 and FIG. 14, the reinforcing part removing unit 194 includes a laser beam irradiation unit 244 that irradiates the root of the ring-shaped reinforcing part 24, which is formed at the outer circumference of the wafer 4, with a laser beam to form a cut groove, a first raising-lowering table 246 (see FIG. 1) that holds and raises the frame unit U temporarily placed on the temporary placement table 204 and that moves the frame unit U in the X-axis direction to position it to the laser beam irradiation unit 244, and a separating part 248 that separates the ring-shaped reinforcing part 24 from the cut groove.

(Laser Beam Irradiation Unit 244 of Reinforcing Part Removing Unit 194)

As illustrated in FIG. 14, the laser beam irradiation unit 244 includes a housing 250 disposed adjacent to the temporary placement table 204 in the X-axis direction, a laser oscillator (not illustrated) that is housed in the housing 250 and that oscillates a laser, and a light collector 252 that focuses the laser beam emitted by the laser oscillator and that irradiates, with the laser beam, the root of the ring-shaped reinforcing part 24 formed at the outer circumference of the wafer 4. The laser beam irradiation unit 244 further includes a suction nozzle 254 that sucks debris generated when the wafer 4 is irradiated with the laser beam, and suction means (not illustrated) connected to the suction nozzle 254.

The light collector 252 extends upward from the upper surface of the housing 250 with an inclination toward the side of the suction nozzle 254. With this, dropping of debris generated in the irradiation with the laser beam onto the light collector 252 is suppressed. Further, the suction nozzle 254 extends upward from the upper surface of the housing 250 with an inclination toward the side of the light collector 252.

Figure 15:
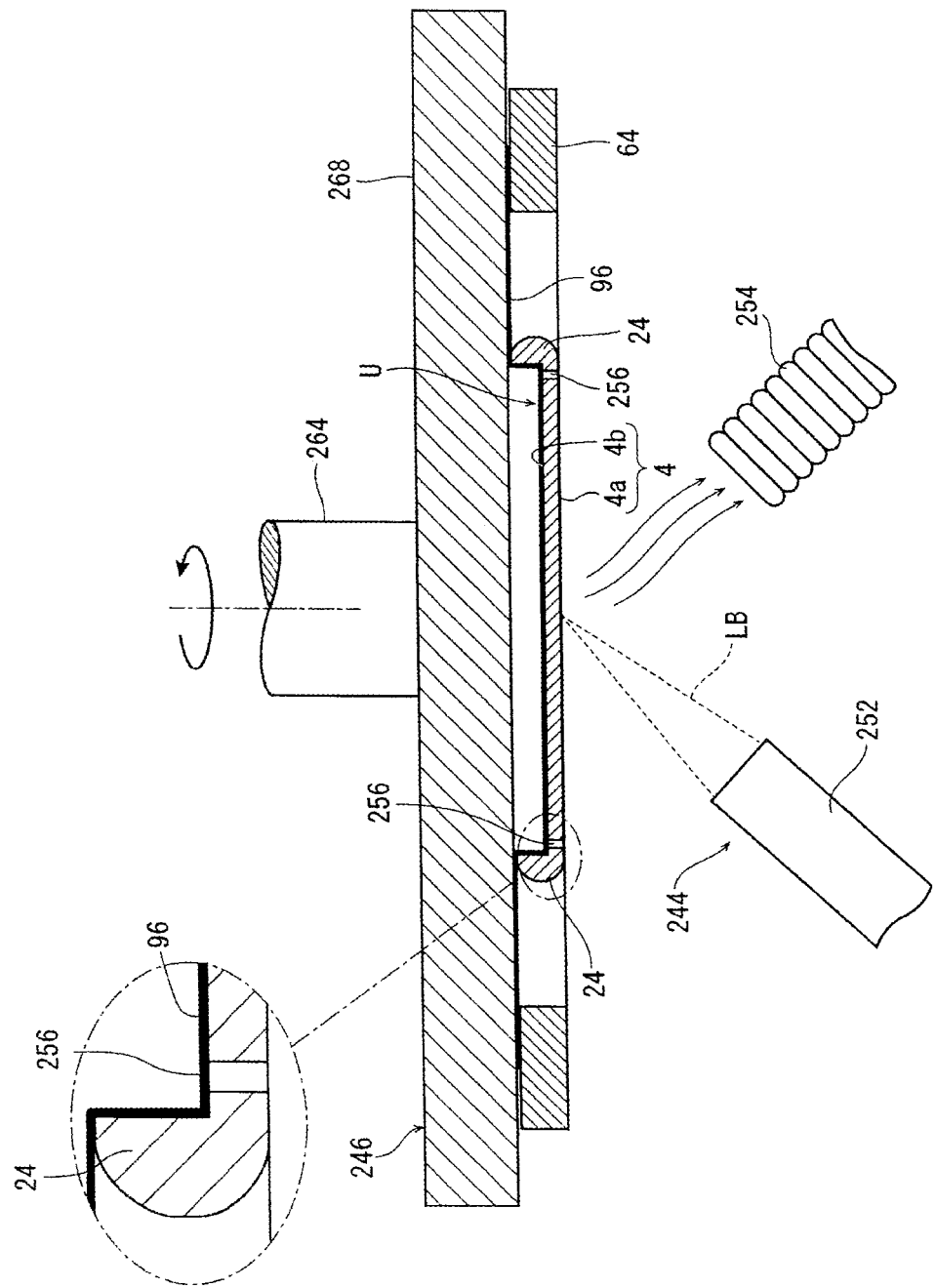
FIG. 15 is a schematic diagram illustrating the state in which the root of a ring-shaped reinforcing part of the wafer is being irradiated with a laser beam in a reinforcing part removal step.

As illustrated in FIG. 15, the laser beam irradiation unit 244 irradiates the root of the ring-shaped reinforcing part 24, which is formed at the outer circumference of the wafer 4, with a laser beam LB while the frame unit U held by the first raising-lowering table 246 is rotated, to form a ring-shaped cut groove 256 along the root of the reinforcing part 24 by ablation processing. Moreover, the laser beam irradiation unit 244 sucks debris generated due to the ablation processing by the suction nozzle 254.

(First Raising-Lowering Table 246 of Reinforcing Part Removing Unit 194)

Figure 16:
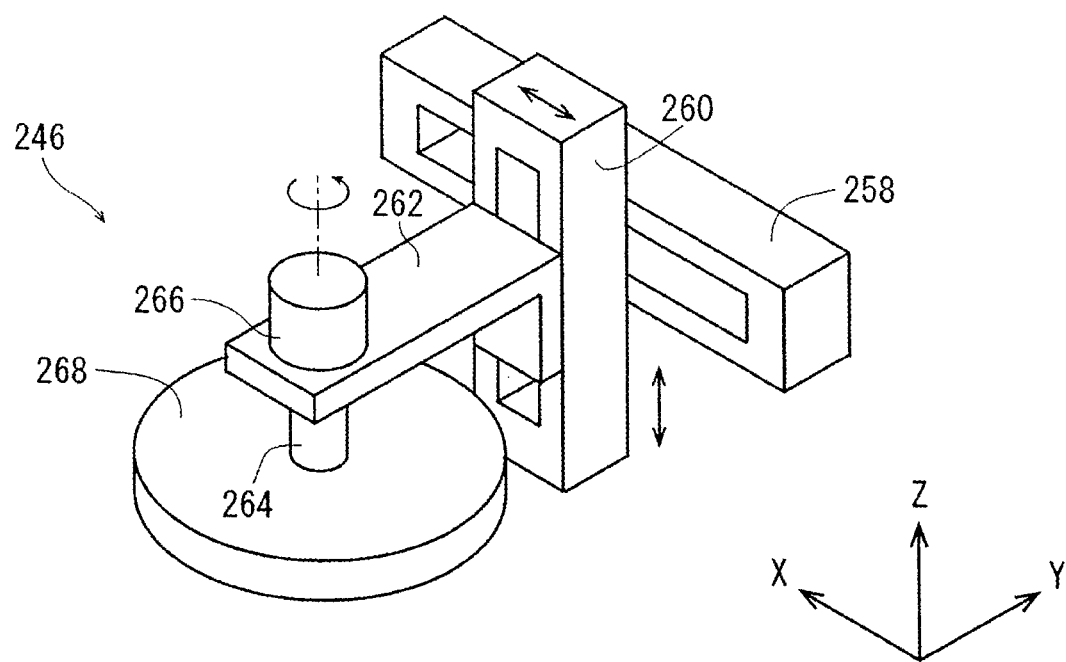
FIG. 16 is a perspective view of a first raising-lowering table of the reinforcing part removing unit illustrated in FIG. 1.

As illustrated in FIG. 1, the first raising-lowering table 246 is disposed above the temporary placement table 204 movably in the X-axis direction and movably in the Z-axis direction. Referring to FIG. 16, the first raising-lowering table 246 includes an X-axis guide member 258 that is fixed to an appropriate bracket (not illustrated) and that extends in the X-axis direction, an X-axis movable member 260 supported by the X-axis guide member 258 movably in the X-axis direction, an X-axis feed mechanism (not illustrated) that moves the X-axis movable member 260 in the X-axis direction, a Z-axis movable member 262 supported by the X-axis movable member 260 movably in the Z-axis direction, and a Z-axis feed mechanism (not illustrated) that moves the Z-axis movable member 262 in the Z-axis direction. Each of the X-axis and Z-axis feed mechanisms of the first raising-lowering table 246 may include a ball screw and a motor that rotates the ball screw.

A support shaft 264 extending downward is rotatably supported by the lower surface of the tip of the Z-axis movable member 262. A motor 266 that rotates the support shaft 264 around an axis line extending in the Z-axis direction is attached to the upper surface of the tip of the Z-axis movable member 262. A circular suction adhesion piece 268 is fixed to the lower end of the support shaft 264. In the lower surface of the suction adhesion piece 268, multiple suction holes (not illustrated) are formed on a circumference corresponding to the size of the annular frame 64 at intervals in the circumferential direction. Each suction hole is connected to suction means.

The first raising-lowering table 246 holds the annular frame 64 of the frame unit U under suction by the suction adhesion piece 268. Thereafter, the first raising-lowering table 246 moves the Z-axis movable member 262 and the X-axis movable member 260 to raise the frame unit U held under suction by the suction adhesion piece 268 and move the frame unit U in the X-axis direction, positioning it to the laser beam irradiation unit 244. When the annular frame 64 is formed of a material having magnetism, an electromagnet (not illustrated) may be annexed to the lower surface of the suction adhesion piece 268, and the suction adhesion piece 268 may cause adhesion of the annular frame 64 by a magnetic force.

Further, when the wafer 4 is irradiated with the laser beam LB by the laser beam irradiation unit 244, the first raising-lowering table 246 actuates the motor 266 to rotate the frame unit U held under suction by the suction adhesion piece 268. Moreover, the first raising-lowering table 246 moves the frame unit U in which the cut groove 256 has been formed at the root of the reinforcing part 24, in the X-axis direction and the Z-axis direction, and temporarily places it on the temporary placement table 204.

(Separating Part 248 of Reinforcing Part Removing Unit 194)

Figure 17A:
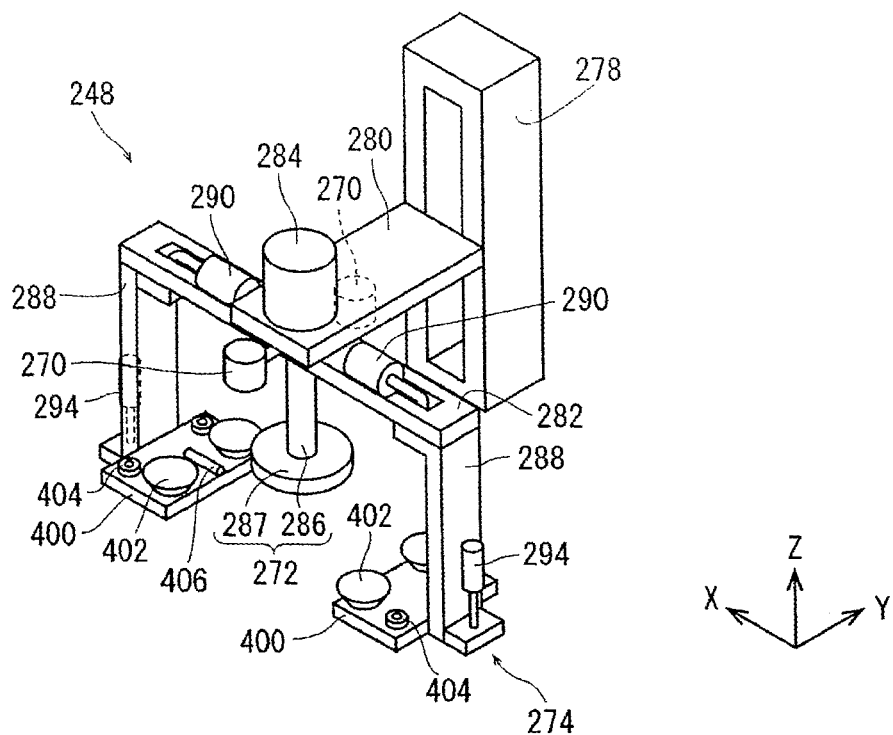
FIG. 17A is a perspective view of a separating part of the reinforcing part removing unit illustrated in FIG. 1.
Figure 17B:
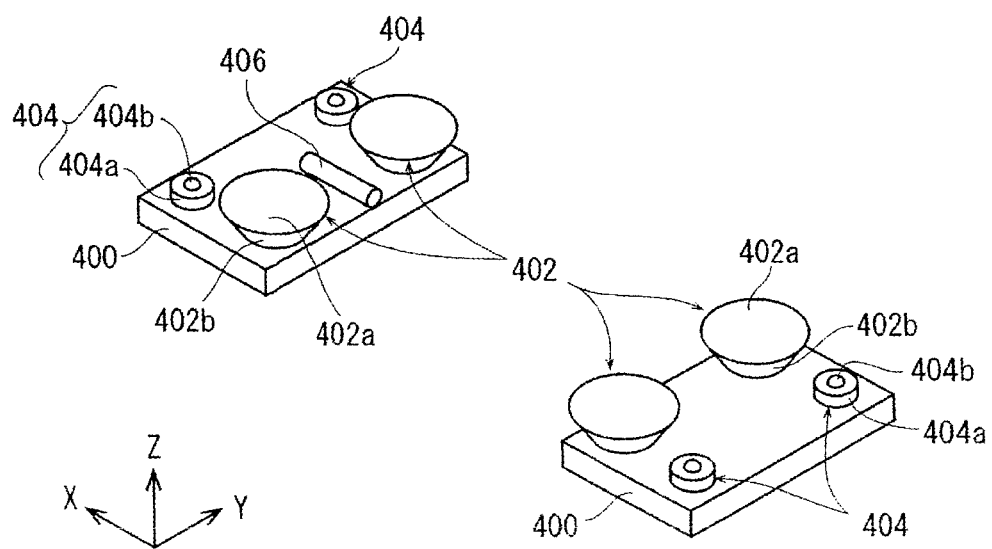
FIG. 17B is an enlarged perspective view of support boards illustrated in FIG. 17A.
Figure 18:
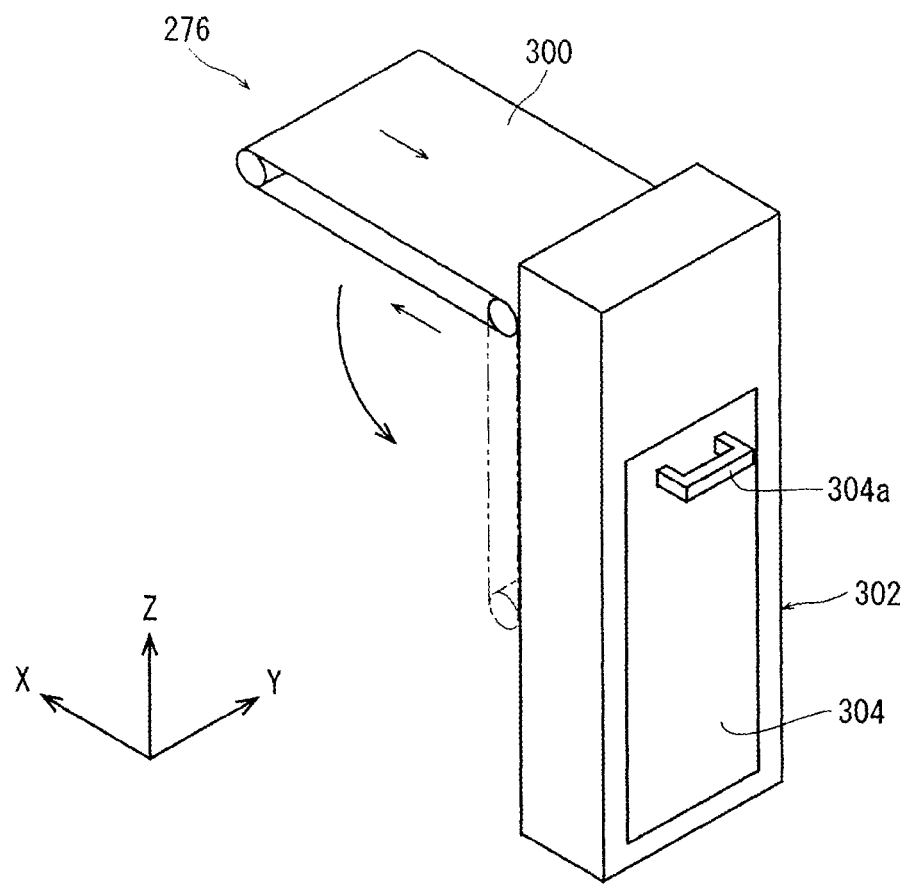
FIG. 18 is a perspective view of a discard part of the reinforcing part removing unit illustrated in FIG. 1.

As illustrated in FIG. 1, the separating part 248 is spaced from the first raising-lowering table 246 in the Y-axis direction in the movable range of the temporary placement table 204 in the Y-axis direction. Referring to FIG. 17A, FIG. 17B, and FIG. 18, the separating part 248 includes ultraviolet irradiation parts 270 (see FIG. 17A) that irradiate a portion of the tape 96 corresponding to the cut groove 256 with ultraviolet to reduce the adhesive force of the tape 96, and a second raising-lowering table 272 (see FIG. 17A) that holds an inner portion of the wafer 4 under suction in such a manner that the ring-shaped reinforcing part 24 is exposed from the outer circumference. The separating part 248 further includes a separator 274 (see FIG. 17A) that causes tops 402 having a wedge to act on the outer circumference of the ring-shaped reinforcing part 24 and separates the ring-shaped reinforcing part 24, and a discard part 276 (see FIG. 18) by which the separated ring-shaped reinforcing part 24 is discarded.

As illustrated in FIG. 17A, the separating part 248 of the present embodiment includes a Z-axis guide member 278 that is fixed to an appropriate bracket (not illustrated) and that extends in the Z-axis direction, a Z-axis movable member 280 supported by the Z-axis guide member 278 movably in the Z-axis direction, and raising-lowering means (not illustrated) that moves the Z-axis movable member 280 in the Z-axis direction. The raising-lowering means may include a ball screw that is coupled to the Z-axis movable member 280 and that extends in the Z-axis direction and a motor that rotates this ball screw.

On the lower surface of the tip of the Z-axis movable member 280, a support piece 282 is supported, and the second raising-lowering table 272 is rotatably supported. A motor 284 that rotates the second raising-lowering table 272 is attached to the upper surface of the tip of the Z-axis movable member 280. A pair of the above-described ultraviolet irradiation parts 270 spaced from each other in the Y-axis direction are annexed to the support piece 282 of the present embodiment.

The second raising-lowering table 272 has a support shaft 286 extending downward from the lower surface of the tip of the Z-axis movable member 280 and a circular table head 287 attachably-detachably mounted on the lower end of the support shaft 286. Multiple suction holes (not illustrated) are formed in the lower surface of the table head 287, and each suction hole is connected to suction means.

The table head 287 has an outer diameter corresponding to the inner diameter of the reinforcing part 24 of the wafer 4. Specifically, the diameter of the table head 287 is slightly smaller than that of the device region 18 of the wafer 4. Further, the table head 287 is attachably-detachably mounted on the support shaft 286 and can be replaced according to the diameter of the wafer 4. The support shaft 286 on which the table head 287 is mounted is connected to the raising-lowering means of the separating part 248 through the Z-axis movable member 280. As described above, the second raising-lowering table 272 includes two or more kinds of table heads 287 having an outer diameter corresponding to the inner diameter of the reinforcing part 24 of the wafer 4, and the table head 287 is attachably-detachably mounted to the raising-lowering means of the separating part 248.

Further, the above-described separator 274 is mounted on the support piece 282. The separator 274 includes a pair of movable pieces 288 spaced from each other and disposed on the lower surface of the support piece 282 movably in the longitudinal direction of the support piece 282, a pair of feed means 290 that move the pair of movable pieces 288, a pair of support boards 400 supported by the respective movable pieces 288 in such a manner as to be capable of rising and lowering, and a pair of Z-axis feed mechanisms 294 that raise and lower the pair of support boards 400 in the Z-axis direction. The pair of feed means 290 and the pair of Z-axis feed mechanisms 294 each can include an appropriate actuator such as an air cylinder or an electric cylinder.

The description will be continued with reference to FIG. 17A and FIG. 17B. On the upper surface of the support board 400, the tops 402 having a wedge, frame support parts 404 that support the annular frame 64, and an ionizer 406 that removes static electricity from the frame unit U are mounted.

The top 402 has an inverted truncated cone shape in which the diameter gradually decreases from the upper side toward the lower side, and the wedge is formed by an upper surface 402a and a side surface 402b of the top 402. A pair of tops 402 are disposed on the upper surface of each support board 400 and spaced from each other. Also, the pair of tops 402 are supported by the support board 400 rotatably around an axis line extending in the Z-axis direction.

A pair of frame support parts 404 are disposed adjacent to the tops 402 on the upper surface of each of the support boards 400. The frame support parts 404 each have a housing 404a fixed to the support board 400 and a sphere 404b rotatably supported by the housing 404a. In the frame support parts 404, the annular frame 64 is supported by the respective spheres 404b.

The ionizer 406 is disposed adjacent to the tops 402. The ionizer 406 removes static electricity from the frame unit U by blowing ionized air toward the frame unit U.

The separating part 248 of the present embodiment includes detecting means (not illustrated) that detects whether or not the kind of table head 287 input to a control unit (not illustrated) that controls the operation of the processing apparatus 2 corresponds with the kind of table head 287 actually mounted in the processing apparatus 2.

The control unit include a computer having a central processing unit (CPU) that executes calculation processing according to a control program, a read only memory (ROM) that stores the control program and so forth, and a readable-writable random access memory (RAM) that stores a calculation result and so forth. Processing conditions such as the diameter of the wafer 4, the width of the reinforcing part 24, and the outer diameter of the table head 287 are input to the control unit by an operator.

Figure 19:
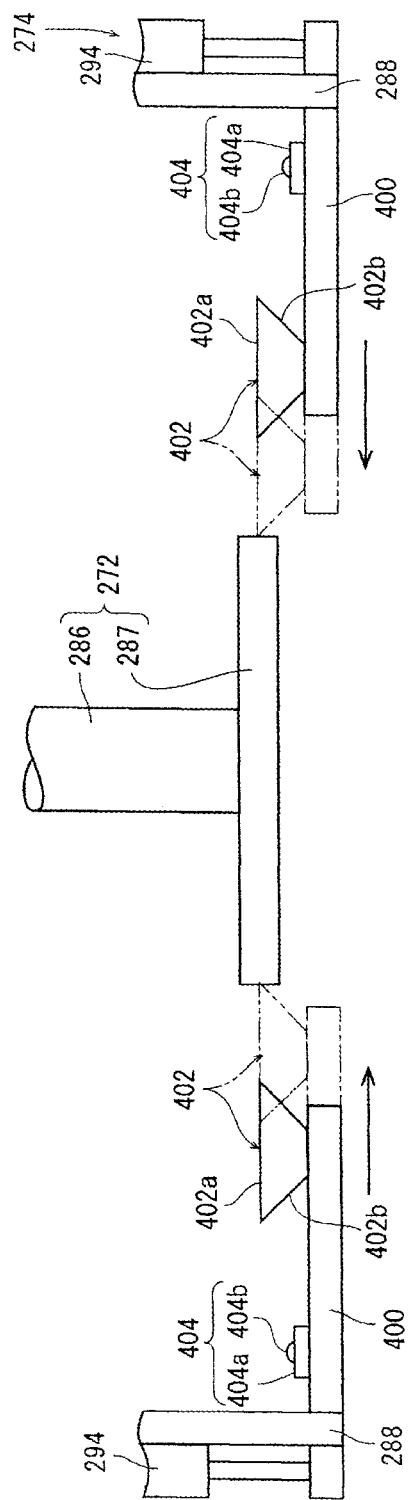
FIG. 19 is a schematic diagram illustrating the state in which tops are brought into contact with a table head illustrated in FIG. 1 and the outer diameter of the table head is detected.

The detecting means of the present embodiment includes the tops 402 of the separator 274 and the feed means 290 that cause the tops 402 to get closer to and get further away from the table head 287 by actuating the movable pieces 288. Further, in the detecting means, before processing of the wafer 4 is started, the movable pieces 288 are actuated by the feed means 290, and, as illustrated in FIG. 19, whether or not the outer diameter of the table head 287 obtained through bringing the tops 402 of the separator 274 into contact with the outer circumference of the table head 287 corresponds with the outer diameter of the table head 287 input to the control unit is detected. When it is detected by the detecting means that both do not correspond with each other, an error notification (for example, display indicating the non-correspondence on a control panel (not illustrated)) is made.

Even when the wafers 4 have the same diameter of, for example, 200 mm, the width of the ring-shaped reinforcing part 24 may be different among the wafers 4, for example, 3 mm, 5 mm, and so forth, in some cases. Thus, the table head 287 corresponding to the device region 18 of the wafer 4 needs to be mounted in the processing apparatus 2. If the kind of table head 287 input to the control unit does not correspond with the kind of table head 287 actually mounted, it becomes impossible to properly remove the ring-shaped reinforcing part 24 from the wafer 4.

Regarding this point, the processing apparatus 2 of the present embodiment includes the detecting means that detects whether or not the kind of table head 287 input to the control unit corresponds with the kind of table head 287 actually mounted in the processing apparatus 2. Therefore, whether or not the proper table head 287 corresponding to the wafer 4 is mounted can be checked before processing of the wafer 4 is started, and the ring-shaped reinforcing part 24 can properly be removed from the wafer 4 at the time of the processing of the wafer 4.

Referring to FIG. 18, the discard part 276 includes a belt conveyor 300 that conveys the separated ring-shaped reinforcing part 24 and a dust box 302 in which the ring-shaped reinforcing part 24 conveyed by the belt conveyor 300 is housed. The belt conveyor 300 is moved by an appropriate actuator (not illustrated) to a collection position (position illustrated by solid lines in FIG. 18) at which the belt conveyor 300 substantially horizontally extends and a standby position (position illustrated by two-dot chain lines in FIG. 18) at which the belt conveyor 300 substantially vertically extends.

A door 304 to which a handle 304a is annexed is disposed at the side surface of the dust box 302 on the near side in the X-axis direction in FIG. 18. A crusher (not illustrated) that crushes the collected ring-shaped reinforcing part 24 is attached inside the dust box 302. The dust box 302 is configured in such a manner that crushed waste of the ring-shaped reinforcing part 24 housed in the dust box 302 can be taken out when the handle 304a is used to open the door 304.

Figure 20:
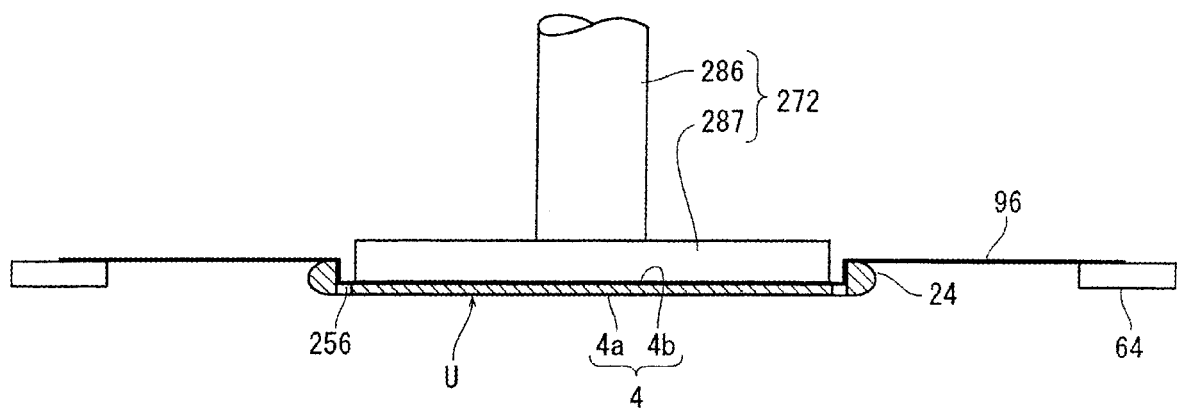
FIG. 20 is a schematic diagram illustrating the state in which the wafer is held under suction by a second raising-lowering table in the reinforcing part removal step.
Figure 21:
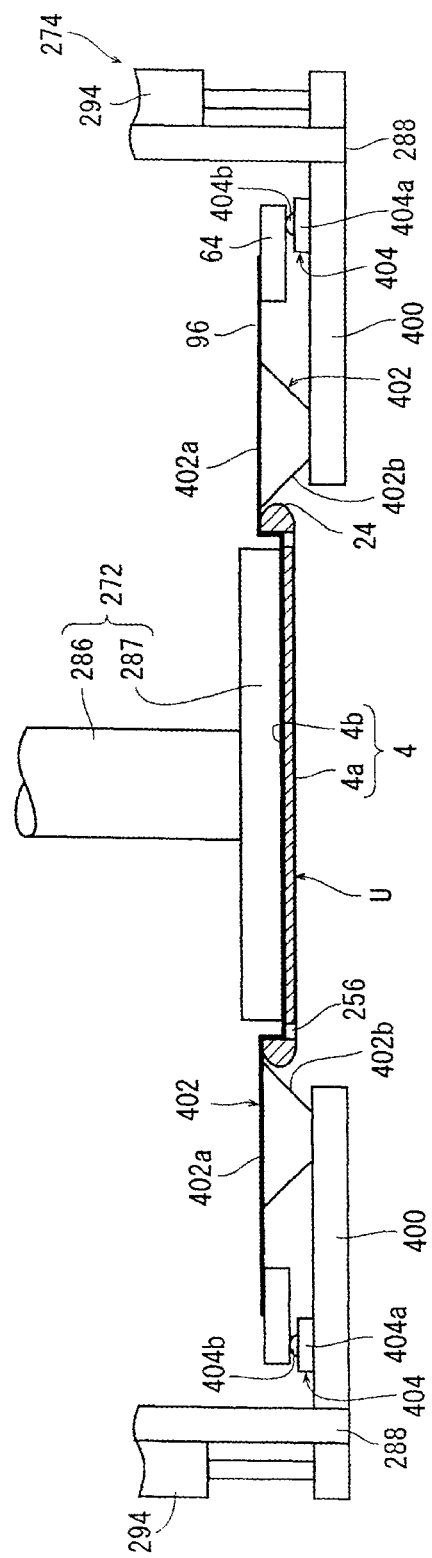
FIG. 21 is a schematic diagram illustrating the state in which the tops of the reinforcing part removing unit are caused to act on the outer circumference of the ring-shaped reinforcing part in the reinforcing part removal step.

When the temporary placement table 204 on which the frame unit U in which the cut groove 256 has been formed at the root of the reinforcing part 24 is temporarily placed is positioned below the separating part 248 by the temporary placement table conveying part 232, as illustrated in FIG. 20, the separating part 248 holds the inner portion of the wafer 4 under suction by the second raising-lowering table 272 with the ring-shaped reinforcing part 24 exposed from the outer circumference. Subsequently, the movable pieces 288 are moved by the feed means 290, and the support boards 400 are moved by the Z-axis feed mechanisms 294. Then, as illustrated in FIG. 21, the tops 402 having the wedge are caused to act on the outer circumference of the ring-shaped reinforcing part 24. Specifically, the wedges of the tops 402 are positioned between the tape 96 and the reinforcing part 24. Further, the lower surface of the annular frame 64 is brought into contact with the spheres 404b of the frame support parts 404, and the annular frame 64 is supported by the spheres 404b.

Figure 22:
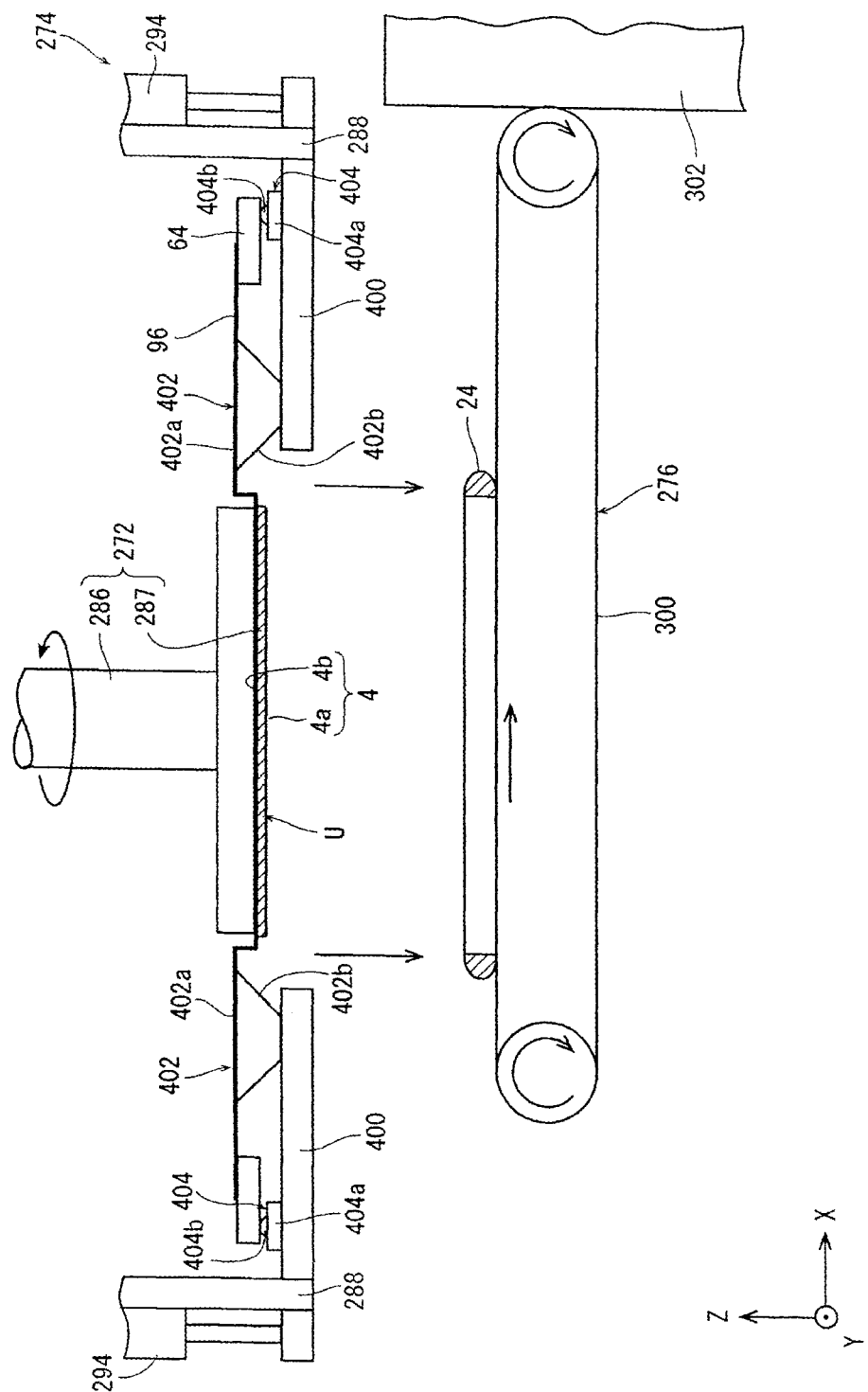
FIG. 22 is a schematic diagram illustrating the state in which the reinforcing part has been separated from the wafer in the reinforcing part removal step.

Next, irradiation with ultraviolet from the pair of ultraviolet irradiation parts 270 is executed to reduce the adhesive force of the tape 96 sticking to the ring-shaped reinforcing part 24. In addition, the frame unit U is rotated together with the second raising-lowering table 272 by the motor 284 relative to the separator 274. Thus, the tape 96 in which the adhesive force has been reduced is detached from the reinforcing part 24 by the wedges of the tops 402. Thus, as illustrated in FIG. 22, the ring-shaped reinforcing part 24 can be separated from the frame unit U. The separated reinforcing part 24 is conveyed to the dust box 302 by the belt conveyor 300 and is collected. When the reinforcing part 24 is separated, the separator 274 may be rotated relative to the frame unit U.

Moreover, when the reinforcing part 24 is separated, ionized air is blown from the ionizer 406 toward the frame unit U. With this, even when static electricity is generated due to contact of the tops 402 with the tape 96 and the reinforcing part 24, the static electricity is removed by the ionized air blown from the ionizer 406. This keeps the tape 96 and the reinforcing part 24 from being attracted to each other due to the static electricity, and the reinforcing part 24 is surely separated from the frame unit U.

When the reinforcing part 24 is separated, together with the relative rotation of the frame unit U and the separator 274, the tops 402 that act on the frame unit U rotate, and the spheres 404b in contact with the lower surface of the annular frame 64 also rotate. Therefore, the relative rotation of the frame unit U and the separator 274 is smoothly executed.

(Ring-Free Unit Carrying-Out Means 196)

Figure 23:
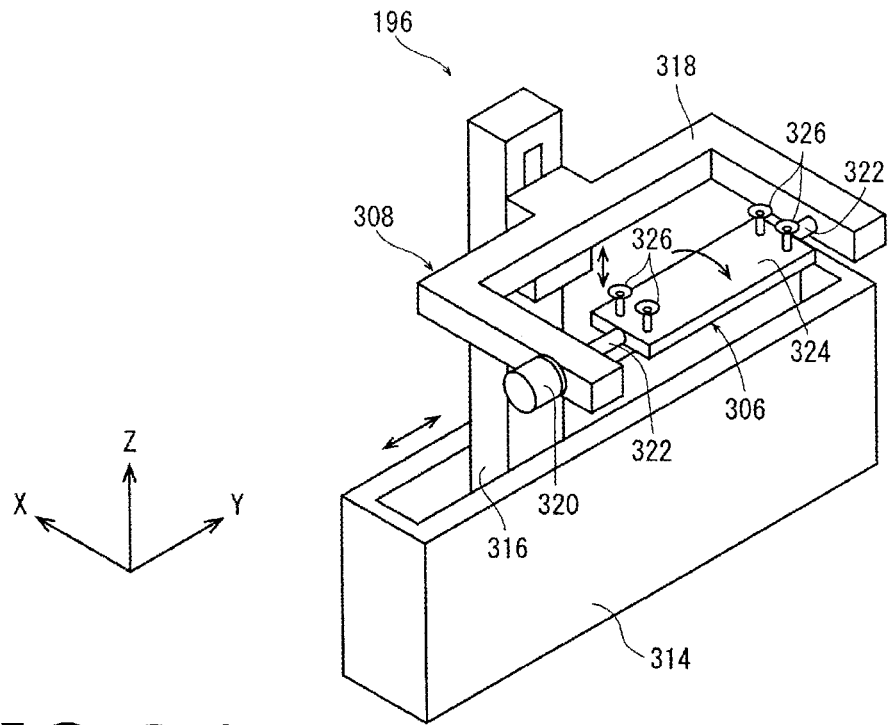
FIG. 23 is a perspective view of an inversion mechanism of ring-free unit carrying-out means illustrated in FIG. 1.
Figure 24:
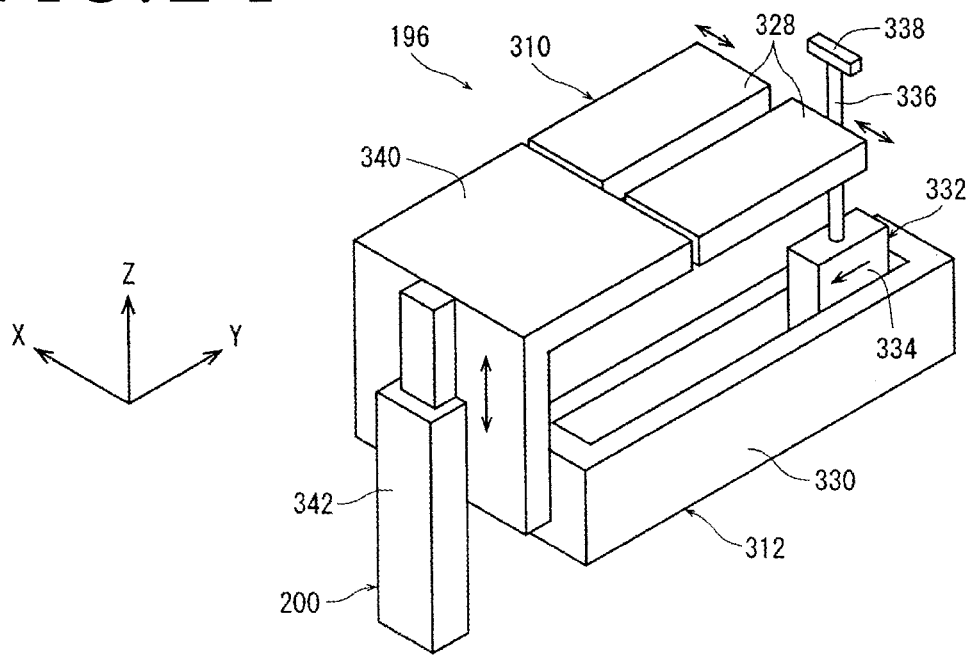
FIG. 24 is a perspective view of a ring-free unit support part and a pushing part of the ring-free unit carrying-out means illustrated in FIG. 1.

As illustrated in FIG. 1, the ring-free unit carrying-out means 196 is disposed adjacent to the reinforcing part removing unit 194. Referring to FIG. 23 and FIG. 24, the ring-free unit carrying-out means 196 of the present embodiment includes an inversion mechanism 308 (see FIG. 23) that includes a frame holding part 306 facing the ring-free unit supported by the second raising-lowering table 272 and being configured to hold the annular frame 64 and that moves toward the frame cassette table 200 and also inverts the frame holding part 306, a ring-free unit support part 310 (see FIG. 24) that supports the ring-free unit inverted by the inversion mechanism 308, and a pushing part 312 (see FIG. 24) that causes the ring-free unit supported by the ring-free unit support part 310 to enter the frame cassette 198 placed on the frame cassette table 200 and be housed therein.

(Inversion Mechanism 308 of Ring-Free Unit Carrying-Out Means 196)

As illustrated in FIG. 23, the inversion mechanism 308 includes a Y-axis guide member 314 extending in the Y-axis direction, a Y-axis movable member 316 supported by the Y-axis guide member 314 movably in the Y-axis direction, a Y-axis feed mechanism (not illustrated) that moves the Y-axis movable member 316 in the Y-axis direction, an arm 318 supported by the Y-axis movable member 316 movably in the Z-axis direction, and a Z-axis feed mechanism (not illustrated) that moves the arm 318 in the Z-axis direction. Each of the Y-axis and Z-axis feed mechanisms of the inversion mechanism 308 may include a ball screw and a motor that rotates the ball screw.

The above-described frame holding part 306 is supported by the arm 318 in such a manner as to be capable of vertically inverting. In addition, a motor 320 that vertically inverts the frame holding part 306 is attached to the arm 318. The frame holding part 306 of the present embodiment includes a board 324 rotatably supported by the arm 318 through a pair of rotating shafts 322 and multiple suction pads 326 annexed to a single surface of the board 324. Each suction pad 326 is connected to suction means (not illustrated). Further, one rotating shaft 322 is coupled to the motor 320.

In the state in which the suction pads 326 are oriented upward, the inversion mechanism 308 holds under suction, by the suction pads 326, the lower surface of the annular frame 64 of a ring-free unit U' supported by the second raising-lowering table 272 and receives the ring-free unit U' from the second raising-lowering table 272. Further, the inversion mechanism 308 inverts the frame holding part 306 by the motor 320 and then moves the ring-free unit U' held by the frame holding part 306 toward the frame cassette table 200 by moving the Y-axis movable member 316.

(Ring-Free Unit Support Part 310 of Ring-Free Unit Carrying-Out Means 196)

As illustrated in FIG. 24, the ring-free unit support part 310 of the present embodiment includes a pair of support plates 328 supported through an appropriate bracket (not illustrated) movably in the X-axis direction and space adjusting means (not illustrated) that adjusts the space between the pair of support plates 328 in the X-axis direction. The space adjusting means can include an appropriate actuator such as an air cylinder or an electric cylinder.

A heater (not illustrated) is mounted on the pair of support plates 328 that support the ring-free unit U'. In the state in which the space between the pair of support plates 328 is narrowed, the pair of support plates 328 heat the tape 96 of the ring-free unit U' by the heater and thus eliminate slack and wrinkles of the tape 96 caused due to the removal of the reinforcing part 24.

(Pushing Part 312 of Ring-Free Unit Carrying-Out Means 196)

The description will be continued with reference to FIG. 24. The pushing part 312 of the present embodiment includes a Y-axis guide member 330 extending in the Y-axis direction, a Y-axis movable member 332 supported by the Y-axis guide member 330 movably in the Y-axis direction, and a Y-axis feed mechanism (not illustrated) that moves the Y-axis movable member 332 in the Y-axis direction. The Y-axis movable member 332 has a base part 334 supported by the Y-axis guide member 330, a support column 336 extending upward from the upper surface of the base part 334, and a pressing piece 338 annexed to the upper end of the support column 336. The Y-axis feed mechanism of the pushing part 312 may include a ball screw that is coupled to the Y-axis movable member 332 and that extends in the Y-axis direction and a motor that rotates this ball screw.

Figure 25:
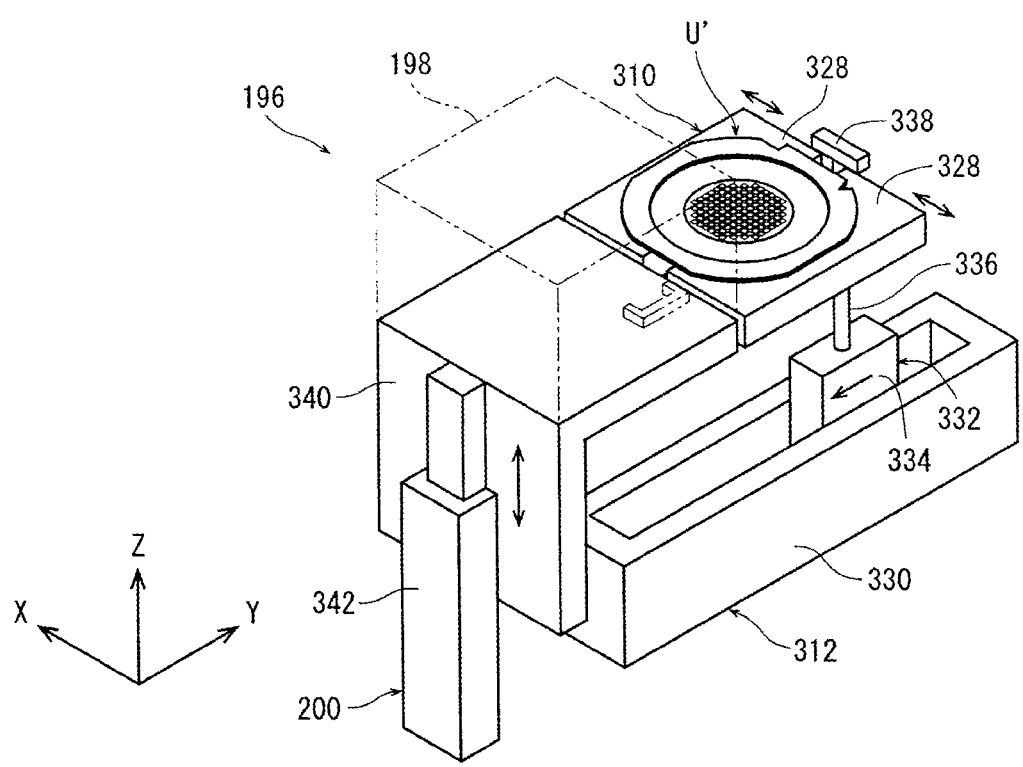
FIG. 25 is a perspective view illustrating the state in which a ring-free unit housing step is being executed.

As illustrated in FIG. 25, the ring-free unit support part 310 expands the space between the pair of support plates 328 by the space adjusting means before receiving the ring-free unit U', and then receives the ring-free unit U' held by the suction pads 326. When the ring-free unit support part 310 has received the ring-free unit U', the pushing part 312 then moves the Y-axis movable member 332 in the Y-axis direction by the Y-axis feed mechanism and thus causes, with the use of the pressing piece 338, the ring-free unit U' supported by the ring-free unit support part 310 to enter the frame cassette 198 placed on the frame cassette table 200, so that the ring-free unit U' is housed in the frame cassette 198.

(Frame Cassette 198 and Frame Cassette Table 200)

In the frame cassette 198 illustrated in FIG. 1 and FIG. 25, multiple ring-free units U' (frame units U in the case of wafers 4' without the reinforcing part) are housed at intervals in the upward-downward direction. As illustrated in FIG. 24 and FIG. 25, the frame cassette table 200 includes a placement part 340 on which the frame cassette 198 is placed and a raising-lowering part 342 that raises and lowers the placement part 340 and that positions it to a desired height. The raising-lowering part 342 may include a ball screw that is coupled to the placement part 340 and that extends in the Z-axis direction and a motor that rotates this ball screw.

Next, description will be made regarding a processing method of, by using the above-described processing apparatus 2, executing pressure bonding of the tape 96 to the wafer 4, which has the ring-shaped reinforcing part 24 in a protrusion shape formed in a region on the back surface 4b corresponding to the outer circumferential surplus region 20, to integrate the wafer 4 with the annular frame 64 and cutting and removing the ring-shaped reinforcing part 24 from the wafer 4.

(Wafer Cassette Placement Step)

In the present embodiment, as illustrated in FIG. 1 and FIG. 3, a wafer cassette placement step is first executed to place the wafer cassette 6 having multiple wafers 4 housed therein on the wafer cassette table 8. In the wafer cassette 6 of the present embodiment, multiple wafers 4 are housed at intervals in the upward-downward direction.

(Frame Housing Step)

Further, as illustrated in FIG. 1 and FIG. 5, a frame housing step is executed to house multiple ring-shaped annular frames 64 each having the opening part 64a for housing the wafer 4 therein in the frame housing unit 66. The frame housing step may be executed before the wafer cassette placement step or may be executed after the wafer cassette placement step.

In the frame housing step, after the rising-lowering plate 74 of the frame housing unit 66 is lowered to a desired position, the handle 76a is used to open the door 76, and the multiple annular frames 64 are stacked on top of one another over the upper surface of the rising-lowering plate 74, so that the multiple annular frames 64 are housed in the frame housing unit 66. Further, the height of the rising-lowering plate 74 is adjusted as appropriate, and the top annular frame 64 is moved to a position from which this annular frame 64 can be carried out by the frame carrying-out unit 68.

(Wafer Carrying-Out Step)

After the wafer cassette placement step and the frame housing step are executed, a wafer carrying-out step is executed to carry the wafer 4 out from the wafer cassette 6 placed on the wafer cassette table 8.

Referring to FIG. 3, in the wafer carrying-out step, the Y-axis feed mechanism 34 of the wafer carrying-out unit 10 is first actuated, and the Y-axis movable member 32 is positioned near the wafer cassette table 8. Subsequently, the conveying arm 42 is driven, and the hand 44 in which the air jet ports 46 are oriented upward is positioned to the lower surface side of the wafer 4 in the wafer cassette 6. When the hand 44 is positioned to the lower surface side of the wafer 4, a gap is made between the lower surface of the wafer 4 and the hand 44, and each guide pin 48 is positioned outside in the radial direction.

Next, compressed air is jetted from the air jet ports 46 of the hand 44 to generate a negative pressure on the lower surface side of the hand 44 by the Bernoulli effect, and the wafer 4 is supported under suction from the lower surface side by the hand 44 in a contactless manner. Subsequently, each guide pin 48 is moved inward in the radial direction, and thus, horizontal movement of the wafer 4 supported under suction by the hand 44 is restricted by the respective guide pins 48. Then, the Y-axis movable member 32 and the conveying arm 42 of the wafer carrying-out unit 10 are moved, and the wafer 4 supported under suction by the hand 44 is carried out from the wafer cassette 6.

(Notch Detection Step)

It is preferable to execute a notch detection step of detecting the position of the notch 26 of the wafer 4 after executing the wafer carrying-out step. In the notch detection step, as illustrated in FIG. 4, the outer circumference of the wafer 4 supported under suction by the hand 44 is positioned between the light emitting element 52 and the light receiving element 54 of the notch detecting unit 50. Next, when the wafer 4 is rotated by the drive source through the guide pin 48, the position of the notch 26 of the wafer 4 is detected. This makes it possible to adjust the orientation of the wafer 4 to a desired orientation.

(Wafer Support Step)

After the notch detection step is executed, a wafer support step is executed to support, by the wafer table 12, the wafer 4 carried out by the wafer carrying-out unit 10.

Referring to FIG. 3, in the wafer support step, the hand 44 of the wafer carrying-out unit 10 is first inverted upside down. Subsequently, the Y-axis movable member 32 and the conveying arm 42 of the wafer carrying-out unit 10 are moved, and the wafer 4 supported under suction by the hand 44 is brought into contact with the wafer support part 56 of the wafer table 12. At this time, the wafer 4 may be in either the state in which the front surface 4a of the wafer 4 is oriented downward or the state in which the back surface 4b of the wafer 4 is oriented downward. When the back surface 4b having the ring-shaped reinforcing part 24 formed thereon is oriented downward, the ring-shaped reinforcing part 24 is housed in the annular recess 62 of the wafer table 12.

Next, the wafer 4 is held under suction by actuating the suction means of the wafer table 12 and generating a suction force for each suction hole 60. Subsequently, the suction support of the wafer 4 by the hand 44 is released, and the hand 44 is separated from the wafer table 12. In this manner, the wafer 4 is transferred from the wafer carrying-out unit 10 to the wafer table 12. Because the wafer 4 transferred to the wafer table 12 is held under suction by each suction hole 60, the position of the wafer 4 does not deviate.

After the wafer 4 is transferred to the wafer table 12, the wafer 4 on the wafer table 12 is imaged from the upper side by the camera 185 (see FIG. 11) disposed in the upper chamber 160. This can detect whether the exposed surface (upper surface) of the wafer 4 is the front surface 4a or the back surface 4b, and check whether or not the surface that should be set as the exposed surface is oriented upward. If the surface that should be set as the exposed surface of the wafer 4 is not oriented upward, information indicating such a wrong orientation is displayed on the control panel (not illustrated). Further, when the exposed surface of the wafer 4 is the front surface 4a, the ID 23 displayed on the front surface 4a of the wafer 4 can be acquired from an image captured by the camera 185.

(Frame Carrying-Out Step)

Further, after the wafer cassette placement step and the frame housing step are executed, concurrently with the wafer carrying-out step and the wafer support step, a frame carrying-out step is executed to carry the annular frame 64 out from the frame housing unit 66.

Referring to FIG. 5, in the frame carrying-out step, the X-axis movable member 84 and the Z-axis movable member 86 of the frame carrying-out unit 68 are first moved, and the suction pads 92 of the holding part 88 are brought into contact with the upper surface of the top annular frame 64 housed in the frame housing unit 66. Next, the top annular frame 64 is held under suction by the suction pads 92 by actuating the suction means of the frame carrying-out unit 68 and generating a suction force for the suction pads 92. Then, the X-axis movable member 84 and the Z-axis movable member 86 of the frame carrying-out unit 68 are moved, and the top annular frame 64 held under suction by the suction pads 92 of the holding part 88 is carried out from the frame housing unit 66.

(Frame Support Step)

After the frame carrying-out step is executed, a frame support step is executed to support, by the frame table 70, the annular frame 64 carried out by the frame carrying-out unit 68.

The description will be continued with reference to FIG. 5. In the frame support step, the X-axis movable member 84 and the Z-axis movable member 86 of the frame carrying-out unit 68 are first moved, and the annular frame 64 held under suction by the suction pads 92 is brought into contact with the upper surface of the frame table 70. At this time, the frame table 70 is moved in advance to a position at which the frame table 70 can receive the annular frame 64. Subsequently, the suction force of the suction pads 92 of the frame carrying-out unit 68 is deactivated to place the annular frame 64 on the frame table 70. Then, the X-axis movable member 84 and the Z-axis movable member 86 of the frame carrying-out unit 68 are moved, and the holding part 88 is separated from the upper side of the frame table 70.

(First Tape Pressure Bonding Step)

After the frame support step is executed, a first tape pressure bonding step is performed to execute pressure bonding of the tape 96 to the annular frame 64.

Referring to FIG. 6 and FIG. 7, in the first tape pressure bonding step, the tape 96 is first pulled out from the roll tape 96R, and the tape 96 from which the release paper 116 has been separated is positioned above the frame table 70 in the state in which the tape 96 is stretched tight without being slacked. When the tape 96 is an adhesive tape, the pressure bonding surface of the tape 96 located above the frame table 70 is oriented downward.

Next, the frame table 70 is raised to the pressure bonding start position (position illustrated in FIG. 8), and the first pressure bonding roller 110 is lowered to the lower-side pressure bonding position (position illustrated in FIG. 8). Thus, tension is applied to the tape 96, and pressure bonding of the tape 96 to one end of the annular frame 64 is executed.

When the frame table 70 is moved to the pressure bonding start position and the first pressure bonding roller 110 is moved to the lower-side pressure bonding position as described above, as illustrated in FIG. 8, an elevation angle α is formed between the annular frame 64 and the tape 96 extending from the first pressure bonding roller 110 toward the guide roller 130 on the lower side.

Next, the first pressure bonding roller 110 is moved in the Y-axis direction toward the other end of the annular frame 64 while the tape 96 is pressed against the annular frame 64 by the first pressure bonding roller 110. Thus, pressure bonding of the tape 96 to the annular frame 64 can be executed in the state in which uniform tension is applied to the tape 96.

Figure 9:
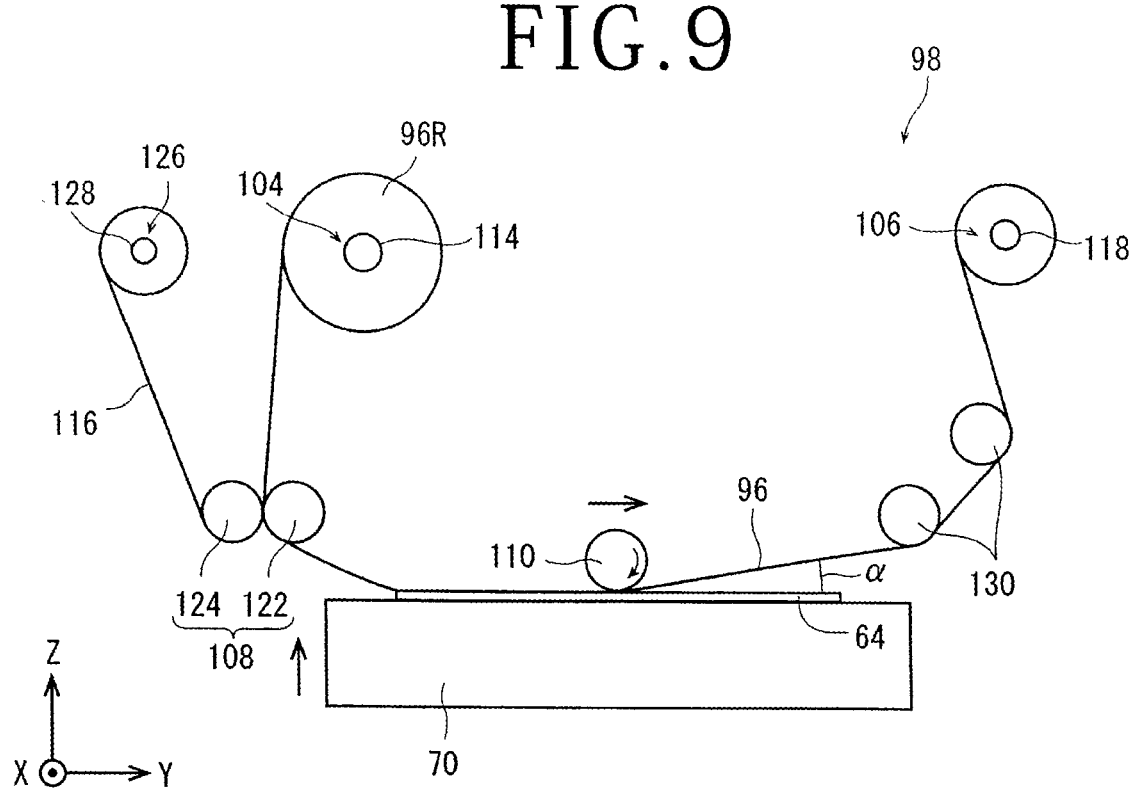
FIG. 9 is a schematic diagram illustrating the state in which the first pressure bonding roller has been moved from the state illustrated in FIG. 8.
Figure 10:
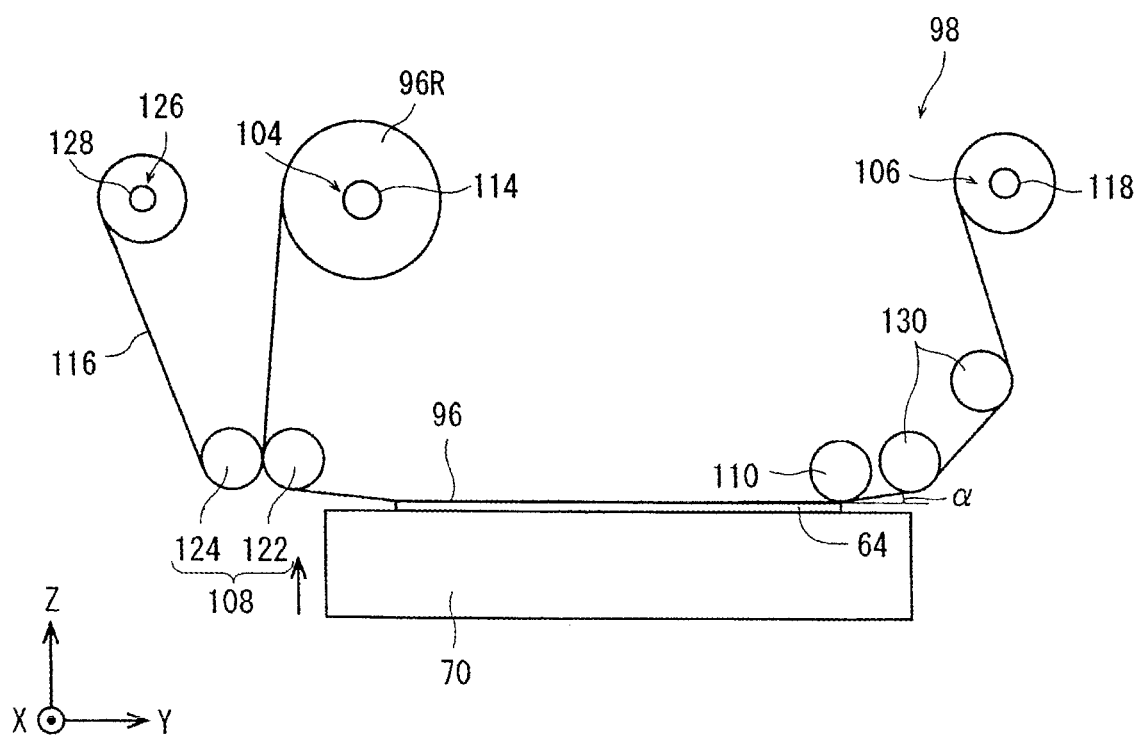
FIG. 10 is a schematic diagram illustrating the state in which the first pressure bonding roller has been further moved from the state illustrated in FIG. 9.

When the first pressure bonding roller 110 is moved, it is preferable to keep the tension applied to the tape 96 constant by raising the frame table 70 in synchronization with the movement of the first pressure bonding roller 110. Specifically, as illustrated in FIG. 9 and FIG. 10, the frame table 70 is gradually raised in synchronization with the movement of the first pressure bonding roller 110 in such a manner that the elevation angle α is constant.

When the tape 96 is a thermocompression bonding tape, the temperature of the upper surface of the frame table 70 or the temperature of the outer circumferential surface of the first pressure bonding roller 110 is adjusted to a temperature at which the tape 96 softens or melts, and then, the first pressure bonding roller 110 is rolled in the Y-axis direction while constant tension is applied to the tape 96 by the first pressure bonding roller 110. Thus, thermocompression bonding of the tape 96 to the annular frame 64 can be executed. Needless to say, also when the thermocompression bonding of the tape 96 is executed, the frame table 70 is gradually raised in synchronization with the movement of the first pressure bonding roller 110 in such a manner that the elevation angle α is constant.

Subsequently, the cutter 144 and the holding-down roller 146 of the cutting part 112 of the first tape pressure bonding unit 98 are lowered to press the cutter 144 against the tape 96 on the annular frame 64 and hold down the annular frame 64 by the holding-down roller 146 from over the tape 96. Next, the arm piece 140 is rotated by the motor 138, and the cutter 144 and the holding-down roller 146 are moved to draw a circle along the annular frame 64. Thus, the tape 96 protruding to the outer circumference of the annular frame 64 can be cut along the annular frame 64.

Further, because the annular frame 64 is held down by the holding-down roller 146 from over the tape 96, deviation of the positions of the annular frame 64 and the tape 96 is prevented when the tape 96 is being cut. The used tape 96 in which the circular opening part 120 is formed is taken up by the tape take-up part 106.

(Tape-Attached Frame Conveyance Step)

After the first tape pressure bonding step is executed, a tape-attached frame conveyance step is executed to convey the annular frame 64 to which the tape 96 is pressure-bonded, i.e., the tape-attached annular frame 64', to the wafer table 12 and place the tape-attached annular frame 64' on the wafer table 12 in such a manner that the front surface 4a or the back surface 4b of the wafer 4 supported by the wafer table 12 is positioned in the opening part 64a of the annular frame 64.

In the tape-attached frame conveyance step, the frame table 70 is first lowered to a position from which the tape-attached annular frame 64' can be carried out by the tape-attached frame conveying unit 100. Subsequently, the Y-axis movable member 150 and the Z-axis movable member 152 of the tape-attached frame conveying unit 100 (see FIG. 5) are moved, and the respective suction pads 158 of the holding part 154 of the tape-attached frame conveying unit 100 are brought into contact with the upper surface of the tape-attached annular frame 64' (see FIG. 11) supported by the frame table 70.

Next, the upper surface of the tape-attached annular frame 64' is held under suction by the suction pads 158 by actuating the suction means of the tape-attached frame conveying unit 100 and generating a suction force for the suction pads 158. Subsequently, the Y-axis movable member 150 and the Z-axis movable member 152 of the tape-attached frame conveying unit 100 are moved, and the tape-attached annular frame 64' held under suction by the suction pads 158 is carried out from the frame table 70.

Next, the tape-attached annular frame 64' held under suction by the suction pads 158 of the tape-attached frame conveying unit 100 is conveyed to the wafer table 12. Then, as illustrated in FIG. 11, the opening part 64a of the annular frame 64 is positioned to the wafer 4 supported by the wafer table 12, and the tape-attached annular frame 64' is brought into contact with the frame support part 58 of the wafer table 12. At this time, the pressure bonding surface of the tape 96 of the tape-attached annular frame 64' is oriented downward. Further, in the present embodiment, the back surface 4b of the wafer 4 is oriented upward and is facing the pressure bonding surface of the tape 96 as illustrated in FIG. 11.

Subsequently, the suction force of the suction pads 158 of the tape-attached frame conveying unit 100 is deactivated to place the tape-attached annular frame 64' on the frame support part 58 of the wafer table 12. Then, the Y-axis movable member 150 and the Z-axis movable member 152 of the tape-attached frame conveying unit 100 are moved, and the holding part 154 is separated from the upper side of the wafer table 12.

(Second Tape Pressure Bonding Step)

After the tape-attached frame conveyance step is executed, a second tape pressure bonding step is performed to execute pressure bonding of the tape 96 of the tape-attached annular frame 64' to the front surface 4a or the back surface 4b of the wafer 4.

Referring to FIG. 11, in the second tape pressure bonding step, the upper chamber 160 is first lowered by the raising-lowering mechanism 164 of the second tape pressure bonding unit 102, and the lower end of the sidewall 172 of the upper chamber 160 is brought into contact with the upper end of the sidewall 186 of the lower chamber 162. Thus, the upper chamber 160 and the lower chamber 162 are set to the closed state. In addition, the second pressure bonding roller 174 is brought into contact with the tape-attached annular frame 64'. Thereupon, the upper end of the ring-shaped reinforcing part 24 of the wafer 4 sticks to the pressure bonding surface of the tape 96 of the tape-attached annular frame 64'.

Next, the vacuum part 166 of the second tape pressure bonding unit 102 is actuated in the state in which the opening-to-atmosphere part 168 is closed, and the inside of the upper chamber 160 and the lower chamber 162 is set to a vacuum state. Subsequently, pressure bonding of the tape 96 to the wafer 4 is executed by rolling the second pressure bonding roller 174 of the second tape pressure bonding unit 102 in the Y-axis direction. Thus, the frame unit U in which the wafer 4 and the tape 96 are pressure-bonded together can be generated. Next, the opening-to-atmosphere part 168 is opened, and the tape 96 is brought into close contact with the wafer 4 along the root of the ring-shaped reinforcing part 24 by the atmospheric pressure. Then, the upper chamber 160 is raised by the raising-lowering mechanism 164.

When the tape 96 is a thermocompression bonding tape, the temperature of the upper surface of the wafer table 12 or the temperature of the outer circumferential surface of the second pressure bonding roller 174 is adjusted to a temperature at which the tape 96 softens or melts, and then, the second pressure bonding roller 174 is rolled. Thus, thermocompression bonding of the tape 96 to the wafer 4 can be executed.

After the frame unit U is generated by executing the pressure bonding of the tape 96 of the tape-attached annular frame 64' to the wafer 4, it is preferable to image the frame unit U by the camera 185 disposed in the upper chamber 160 and detect whether or not the tape 96 is properly pressure-bonded to the wafer 4. When the wafer 4 (for example, root of the reinforcing part 24) is not in close contact with the tape 96 and a gap exists between the wafer 4 and the tape 96, the processing by the processing apparatus 2 is suspended. This can suppress the occurrence of a defect of the device 14 in dicing the wafer 4 into device chips each including the device 14 in a later step.

Figure 12A:
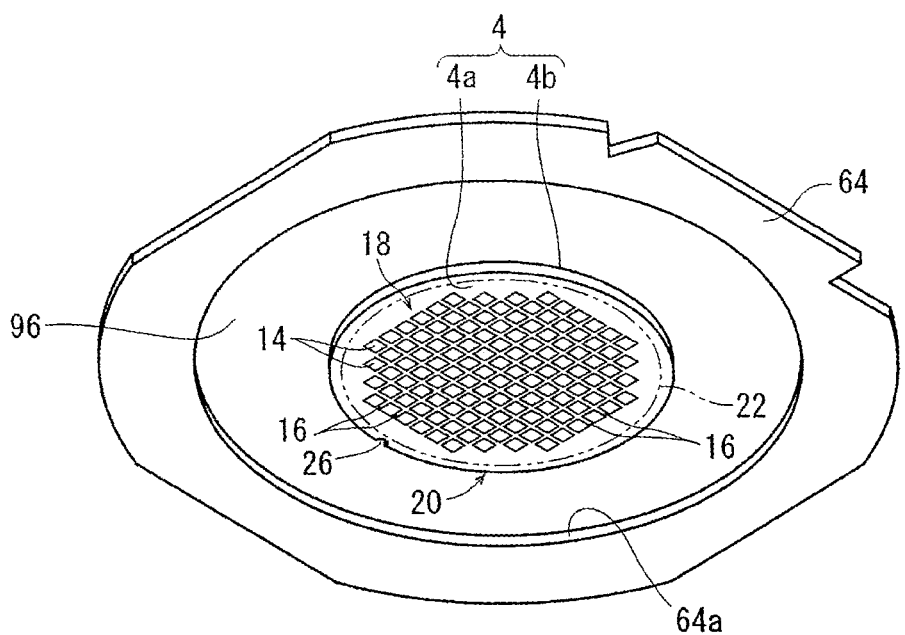
FIG. 12A is a perspective view when the state in which a back surface of the wafer with the reinforcing part illustrated in FIG. 2A is pressure-bonded to the tape of a tape-attached annular frame is viewed from the lower side.
Figure 12B:
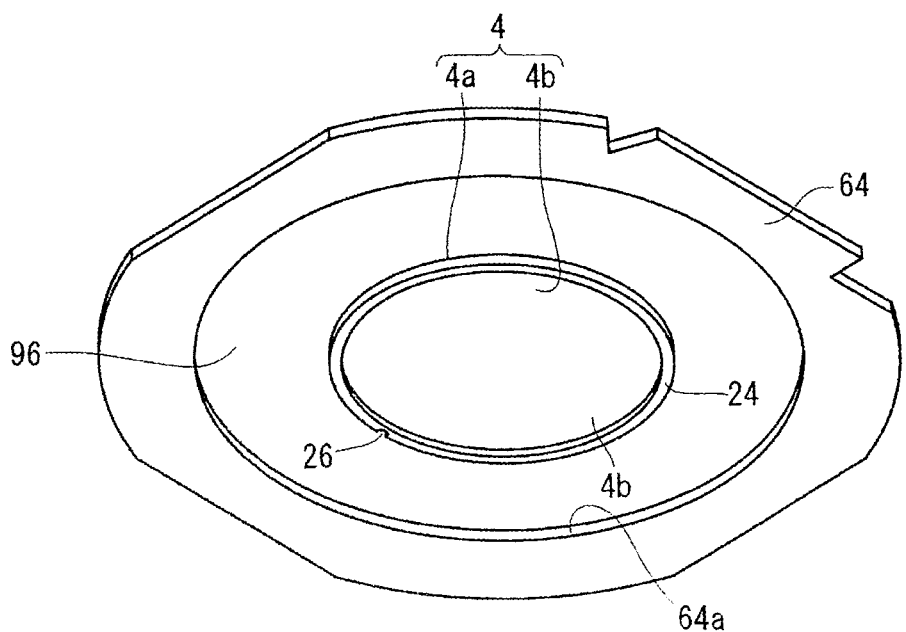
FIG. 12B is a perspective view when the state in which a front surface of the wafer with the reinforcing part illustrated in FIG. 2A is pressure-bonded to the tape of the tape-attached annular frame is viewed from the lower side.

In the present embodiment, as illustrated in FIG. 12A, the tape 96 of the tape-attached annular frame 64' is pressure-bonded to the back surface 4b of the wafer 4 having the ring-shaped reinforcing part 24. However, the tape 96 may be pressure-bonded to the front surface 4a of the wafer 4 as illustrated in FIG. 12B.

Figure 13A:
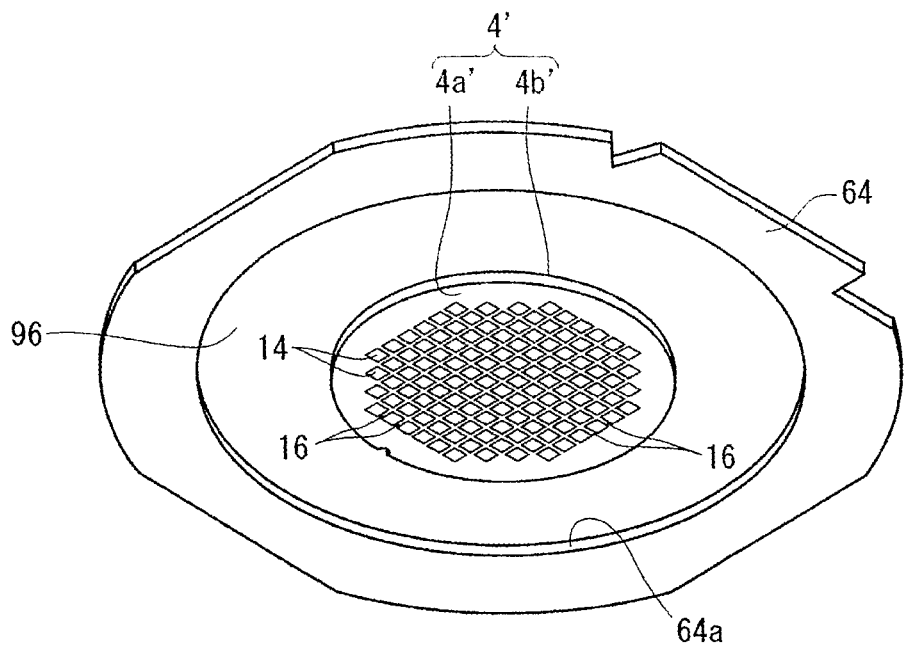
FIG. 13A is a perspective view when the state in which a back surface of the wafer without the reinforcing part illustrated in FIG. 2B is pressure-bonded to the tape of the tape-attached annular frame is viewed from the lower side.
Figure 13B:
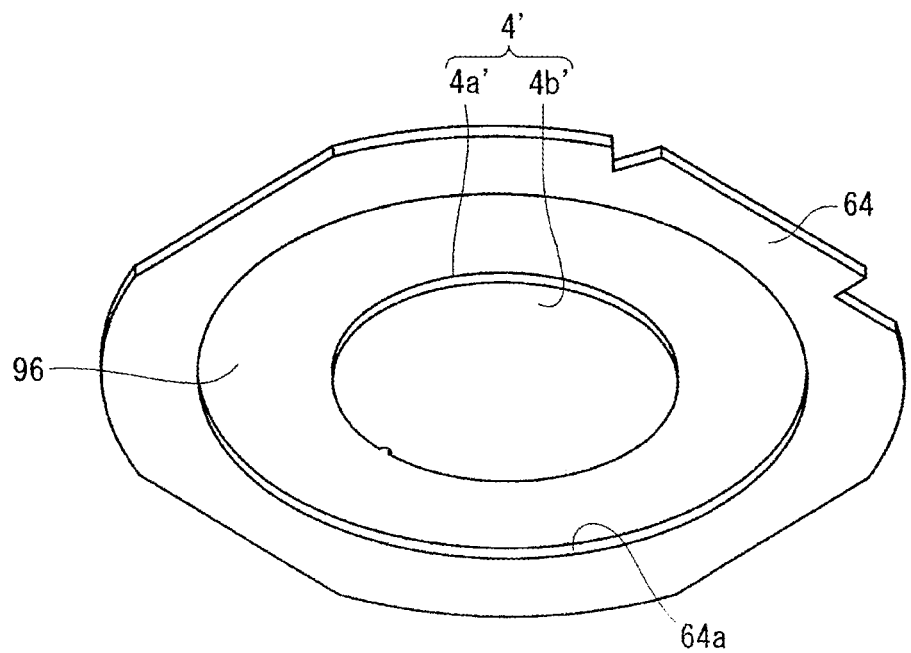
FIG. 13B is a perspective view when the state in which a front surface of the wafer without the reinforcing part illustrated in FIG. 2B is pressure-bonded to the tape of the tape-attached annular frame is viewed from the lower side.

Further, as illustrated in FIG. 13A and FIG. 13B, also in the case of executing pressure bonding of the tape 96 of the tape-attached annular frame 64' to the wafer 4' without the reinforcing part, the surface to which the tape 96 of the tape-attached annular frame 64' is pressure-bonded may be either a front surface 4a' or a back surface 4b' of the wafer 4'.

Incidentally, when the tape 96 is pressure-bonded to the front surface 4a or 4a' of the wafer 4 or 4', cutting processing can be executed for the wafer 4 or 4' by a cutting blade from the side of the back surface 4b or 4b' in a later step. Thus, processing with high quality can be implemented for a wafer of a material with which it is preferable to execute processing from the back surface side in terms of the crystal structure (for example, SiC wafer).

Moreover, in the case in which the tape 96 is pressure-bonded to the front surface 4a or 4a' of the wafer 4 or 4', there is an advantage also when laser processing is executed for the wafer 4 or 4'. Specifically, when the wafer 4 or 4' is irradiated with a laser beam with a wavelength having absorbability with respect to the wafer 4 or 4' from the side of the back surface 4b or 4b' and ablation processing is executed, the devices 14 on the front surface 4a or 4a' are prevented from being contaminated due to debris. In addition, when the wafer 4 or 4' is irradiated with a laser beam with a wavelength having transmissibility with respect to the wafer 4 or 4' with the focal point of the laser beam positioned inside the wafer 4 or 4' from the side of the back surface 4b or 4b' and processing is executed for the inside of the wafer 4 or 4', the processing can be performed without being affected by the devices 14.

When pressure bonding of the tape 96 to the wafer 4 or 4' (particularly, front surface 4a or 4a') is executed, it is desirable to use the thermocompression bonding tape free from the possibility of remaining of an adhesive layer.

(Frame Unit Carrying-Out Step)

After the second tape pressure bonding step is executed, a frame unit carrying-out step is executed to carry, out from the wafer table 12, the frame unit U in which the tape 96 of the tape-attached annular frame 64' and the front surface 4a or the back surface 4b of the wafer 4 are pressure-bonded together.

Referring to FIG. 5, in the frame unit carrying-out step, the conveying part 206 of the frame unit carrying-out means 192 is first actuated, and the lower surface of the suction adhesion piece 210 of the wafer holding part 202a of the frame unit holding part 202 is brought into contact with the wafer 4 with the interposition of the tape 96. In addition, the suction pads 214 of the frame holding part 202b are brought into contact with the annular frame 64.

Subsequently, a suction force is generated for the suction adhesion piece 210 of the wafer holding part 202a and the suction pads 214 of the frame holding part 202b, and the wafer 4 is held under suction by the suction adhesion piece 210 of the wafer holding part 202a. In addition, the annular frame 64 is held under suction by the suction pads 214 of the frame holding part 202b. Next, the suction holding of the wafer 4 by the wafer table 12 is released. Then, the conveying part 206 is actuated, and the frame unit U held by the frame unit holding part 202 is carried out from the wafer table 12.

(Temporary Placement Step)

After the frame unit carrying-out step is executed, a temporary placement step is executed to make the center of the wafer 4 correspond with the center of the temporary placement table 204 and temporarily place the frame unit U on the temporary placement table 204. However, regarding the wafer 4' without the reinforcing part as illustrated in FIG. 2B, the temporary placement step and a reinforcing part removal step to be described later are not executed, and the frame unit U carried out from the wafer table 12 is housed in the frame cassette 198.

Referring to FIG. 14, in the temporary placement step, the frame unit U held by the frame unit holding part 202 is first positioned above the imaging part 224. Subsequently, the conveying part 206 that configures the two-dimensional movement mechanism of the frame unit carrying-out means 192 is actuated, and at least three places at the outer circumference of the wafer 4 of the frame unit U held by the frame unit holding part 202 are imaged by the imaging part 224. Thus, the coordinates of at least three points at the outer circumference of the wafer 4 are measured. Next, the center coordinates of the wafer 4 are obtained on the basis of the measured coordinates of the three points.

Subsequently, the conveying part 206 is actuated to position the center of the wafer 4 to the center of the temporary placement table 204, and the frame unit U is brought into contact with the upper surface of the temporary placement table 204. Next, the suction holding of the wafer 4 by the wafer holding part 202a is released, and the suction holding of the annular frame 64 by the frame holding part 202b is also released, to transfer the frame unit U from the frame unit carrying-out means 192 to the temporary placement table 204.

Subsequently, the heater of the temporary placement table 204 is actuated to heat the tape 96 of the frame unit U temporarily placed on the temporary placement table 204, by the heater. With this, the tape 96 softens and is brought into close contact with the root of the ring-shaped reinforcing part 24 of the wafer 4.

(Reinforcing Part Removal Step)

After the temporary placement step is executed, a reinforcing part removal step is executed to cut and remove the ring-shaped reinforcing part 24 from the wafer 4 of the frame unit U carried out by the frame unit carrying-out means 192.

Referring to FIG. 1, FIG. 14, and FIG. 16, in the reinforcing part removal step, the X-axis movable member 260 and the Z-axis movable member 262 of the first raising-lowering table 246 of the reinforcing part removing unit 194 are first moved, and the lower surface of the suction adhesion piece 268 is brought into contact with the upper surface of the annular frame 64 of the frame unit U temporarily placed on the temporary placement table 204. Next, a suction force is generated for each suction hole of the suction adhesion piece 268 of the first raising-lowering table 246, and the annular frame 64 of the frame unit U is held under suction.

Subsequently, the X-axis movable member 260 and the Z-axis movable member 262 of the first raising-lowering table 246 are actuated, and, as illustrated in FIG. 15, the frame unit U held under suction by the suction adhesion piece 268 is positioned above the laser beam irradiation unit 244. Next, the focal point of the laser beam LB is positioned to the root of the ring-shaped reinforcing part 24 of the wafer 4 of the frame unit U. In FIG. 15, the tape 96 is pressure-bonded to the back surface 4b of the wafer 4 in which the reinforcing part 24 is disposed. However, the tape 96 may be pressure-bonded to the front surface 4a of the wafer 4.

Subsequently, while the suction adhesion piece 268 and the frame unit U are rotated by the motor 266 of the first raising-lowering table 246, the root of the ring-shaped reinforcing part 24 of the wafer 4 is irradiated with the laser beam LB. This can execute ablation processing for the root of the ring-shaped reinforcing part 24 of the wafer 4 and form the ring-shaped cut groove 256. Further, when the wafer 4 is irradiated with the laser beam LB, the suction means of the laser beam irradiation unit 244 is actuated to generate a suction force for the suction nozzle 254, and debris generated due to the ablation processing is sucked by the suction nozzle 254.

Next, the X-axis movable member 260 and the Z-axis movable member 262 of the first raising-lowering table 246 are moved, and the frame unit U held under suction by the suction adhesion piece 268 is brought into contact with the upper surface of the temporary placement table 204. Subsequently, the suction force of the suction adhesion piece 268 of the first raising-lowering table 246 is deactivated to transfer the frame unit U from the first raising-lowering table 246 to the temporary placement table 204.

Next, the temporary placement table 204 that has received the frame unit U is positioned below the separating part 248 of the reinforcing part removing unit 194 by the temporary placement table conveying part 232 (see FIG. 14). At this time, the belt conveyor 300 of the discard part 276 is moved to the standby position. Subsequently, the second raising-lowering table 272 of the separating part 248 is lowered, and the lower surface of the second raising-lowering table 272 is brought into contact with the tape 96 on the inner portion of the wafer 4. Next, a suction force is generated at the lower surface of the second raising-lowering table 272, and, as illustrated in FIG. 20, the inner portion of the wafer 4 of the frame unit U is held under suction by the table head 287 of the second raising-lowering table 272 in the state in which the ring-shaped reinforcing part 24 is exposed from the outer circumference.

Subsequently, the second raising-lowering table 272 that holds the wafer 4 of the frame unit U under suction is raised to separate the frame unit U from the temporary placement table 204. In addition, the temporary placement table 204 is moved to the lower side of the first raising-lowering table 246. Next, the movable pieces 288 are moved by the feed means 290, and the support boards 400 are moved by the Z-axis feed mechanisms 294. Thus, as illustrated in FIG. 21, the tops 402 having a wedge are caused to act on the outer circumference of the ring-shaped reinforcing part 24, and the wedges of the tops 402 are positioned between the tape 96 and the reinforcing part 24. In addition, the annular frame 64 is supported by the spheres 404b of the frame support parts 404. Further, the belt conveyor 300 of the discard part 276 is moved from the standby position to the collection position.

Subsequently, irradiation with ultraviolet from the pair of ultraviolet irradiation parts 270 is executed to reduce the adhesive force of the tape 96 sticking to the ring-shaped reinforcing part 24. In addition, the frame unit U is rotated together with the second raising-lowering table 272 by the motor 284 relative to the separator 274. Moreover, ionized air is blown from the ionizer 406 toward the frame unit U. With this, the ring-shaped reinforcing part 24 can be separated from the frame unit U as illustrated in FIG. 22. In addition, static electricity generated when the reinforcing part 24 is separated does not remain on the frame unit U. The reinforcing part 24 that has dropped from the frame unit U is conveyed to the dust box 302 by the belt conveyor 300 and is collected. When the reinforcing part 24 is separated, the separator 274 may be rotated relative to the frame unit U.

(Ring-Free Unit Carrying-Out Step)

After the reinforcing part removal step is executed, a ring-free unit carrying-out step is executed to carry the ring-free unit U' resulting from the removal of the ring-shaped reinforcing part 24 out from the reinforcing part removing unit 194.

In the ring-free unit carrying-out step, the belt conveyor 300 of the discard part 276 of the reinforcing part removing unit 194 is first moved from the collection position to the standby position. Next, the frame holding part 306 of the inversion mechanism 308 (see FIG. 23) of the ring-free unit carrying-out means 196 is positioned below the ring-free unit U' held under suction by the second raising-lowering table 272.

Subsequently, the arm 318 is raised in the state in which the suction pads 326 of the frame holding part 306 are oriented upward, and the suction pads 326 of the frame holding part 306 are brought into contact with the lower surface side of the annular frame 64 of the ring-free unit U' supported by the second raising-lowering table 272.

Next, a suction force is generated for the suction pads 326 of the frame holding part 306, and the annular frame 64 of the ring-free unit U' is held under suction by the suction pads 326. Subsequently, the suction holding of the ring-free unit U' by the second raising-lowering table 272 is released. Thus, the ring-free unit U' is transferred from the second raising-lowering table 272 of the reinforcing part removing unit 194 to the frame holding part 306 of the ring-free unit carrying-out means 196.

(Ring-Free Unit Housing Step)

After the ring-free unit carrying-out step is executed, a ring-free unit housing step is executed to house the ring-free unit U' carried out by the ring-free unit carrying-out means 196.

In the ring-free unit housing step, the inversion mechanism 308 of the ring-free unit carrying-out means 196 is first inverted upside down, and the ring-free unit U' held under suction by the frame holding part 306 is inverted upside down. With this, the ring-free unit U' is located under the frame holding part 306.

Next, the Y-axis movable member 316 and the arm 318 of the inversion mechanism 308 are moved, and the ring-free unit U' is brought into contact with the upper surfaces of the pair of support plates 328 of the ring-free unit support part 310. At this time, the space between the pair of support plates 328 is narrowed by the space adjusting means, and the pair of support plates 328 are in close contact with each other. Subsequently, the suction holding of the ring-free unit U' by the frame holding part 306 is released to place the ring-free unit U' on the pair of support plates 328. Next, slack and wrinkles of the tape 96 caused due to the removal of the reinforcing part 24 are eliminated by actuating the heater mounted on each support plate 328 and heating the tape 96 of the ring-free unit U'. Then, the ring-free unit U' is held under suction again and is raised by the frame holding part 306.

Next, after the space between the pair of support plates 328 is enlarged by the space adjusting means, the ring-free unit U' is placed on the upper surfaces of the support plates 328. Then, as illustrated in FIG. 25, the ring-free unit U' supported by the ring-free unit support part 310 is pushed by the pressing piece 338 of the pushing part 312, and the ring-free unit U' is caused to enter the frame cassette 198 placed on the frame cassette table 200 and is housed therein.

The configuration of the present embodiment is as above. In the processing apparatus 2 of the present embodiment, work of integrating the wafer 4 and the annular frame 64 through the tape 96 can automatically be executed even when the wafer 4 has the ring-shaped reinforcing part 24 in a protrusion shape formed in a region on the back surface 4b corresponding to the outer circumferential surplus region 20. In addition, the ring-shaped reinforcing part 24 can automatically be cut and removed from the wafer 4.

In the present embodiment, description has been made mainly regarding the case in which the ring-shaped reinforcing part 24 is removed. However, in the case of the wafer 4' without the reinforcing part, there is no need to remove the reinforcing part, and therefore, the processing apparatus 2 can be used without using the reinforcing part removing unit 194 and the ring-free unit carrying-out means 196.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
   a wafer cassette table configured to have placed thereon a wafer cassette having multiple wafers housed therein;
   a wafer carrying-out unit configured to carry a wafer out from the wafer cassette placed on the wafer cassette table;
   a wafer table configured to support the wafer carried out by the wafer carrying-out unit;
   a frame housing unit configured to house multiple annular frames therein, each annular frame having an opening part for housing the wafer therein;
   a frame carrying-out unit configured to carry the annular frame out from the frame housing unit;
   a frame table configured to support the annular frame carried out by the frame carrying-out unit;
   a camera configured to image an exposed surface of the wafer, to which the tape of the tape-attached annular frame is to be pressure-bonded by the second tape pressure bonding unit;
   a first tape pressure bonding unit that is disposed above the frame table and includes a first pressure bonding roller configured to execute pressure bonding of a tape to the annular frame;
   a tape-attached frame conveying unit configured to convey, to the wafer table, the annular frame to which the tape is pressure-bonded, wherein the tape-attached frame conveying unit is also configured to place the tape-attached annular frame on the wafer table in such a manner that a front surface or a back surface of the wafer supported by the wafer table is positioned in the opening part of the annular frame;
   a second tape pressure bonding unit that includes a second pressure bonding roller configured to execute pressure bonding of the tape of the tape-attached roller annular frame to the front surface or the back surface of the wafer;
   frame unit carrying-out means configured to carry, out from the wafer table, a frame unit in which the tape of the tape-attached annular frame and the front surface or the back surface of the wafer are pressure-bonded together by the second tape pressure bonding unit; and
   a frame cassette table configured to have placed thereon a frame cassette configured to house the frame unit therein;
   wherein a first heating unit is disposed in one of or both the frame table and the first pressure bonding roller, and a second heating unit is disposed in one of or both the wafer table and the second pressure bonding roller, and
   either an adhesive tape that has an adhesive layer laid on a sheet or a thermocompression bonding tape that does not have an adhesive layer on a sheet is selectively used as the tape, and
   when the exposed surface of the wafer supported by the wafer table is the front surface, the camera is configured to acquire an identification displayed on the front surface of the wafer.

2. The processing apparatus according to claim 1, wherein:
   a ring-shaped reinforcing part having a protrusion shape is formed in a region on the back surface corresponding to an outer circumferential surplus region of the wafer, and
   the processing apparatus further comprises:
      a reinforcing part removing unit configured to cut and remove the ring-shaped reinforcing part from the wafer of the frame unit carried out by the frame unit carrying-out means, and
      ring-free unit carrying-out means configured to carry a ring-free unit resulting from the removal of the ring-shaped reinforcing part out from the reinforcing part removing unit.

3. The processing apparatus according to claim 1, wherein the first tape pressure bonding unit includes:
   a roll tape support part configured to support a roll tape where the tape that is yet to be used is wound,
   a tape take-up part that takes up the tape that has been used,
   a tape pull-out part configured to pull out the tape from the roll tape,
   the first pressure bonding roller is configured to execute pressure bonding of the tape pulled out to the annular frame, and
   a cutting part configured to cut the tape protruding to an outer circumference of the annular frame along the annular frame.

4. The processing apparatus according to claim 3, wherein:
the tape is a thermocompression bonding tape, and
the first heating unit is configured to be actuated to heat one of or both the frame table and the first pressure bonding roller and to execute thermocompression bonding of the thermocompression bonding tape to the annular frame.

5. The processing apparatus according to claim 1, wherein the second tape pressure bonding unit includes:
an upper chamber disposed above the wafer table,
a lower chamber in which the wafer table is housed,
a raising-lowering mechanism configured to raise and lower the upper chamber and configured to generate a closed state in which the upper chamber is brought into contact with the lower chamber and an opened state in which the upper chamber is separated from the lower chamber,
a vacuum part configured to set the upper chamber and the lower chamber to a vacuum state in the closed state, and
an opening-to-atmosphere part configured to open the upper chamber and the lower chamber to atmosphere, and,
wherein in a state in which the tape of the tape-attached annular frame is positioned to the front surface or the back surface of the wafer supported by the wafer table, the upper chamber and the lower chamber are set to a vacuum state while the closed state is kept through actuating the raising-lowering mechanism, and pressure bonding of the tape of the tape-attached annular frame to the front surface or the back surface of the wafer is configured to be executed by the second pressure bonding roller disposed in the upper chamber.

6. The processing apparatus according to claim 5, wherein, wherein:
the tape is a thermocompression bonding tape, and
the second heating unit is configured to be actuated to heat one of or both the wafer table and the second pressure bonding roller and to execute thermocompression bonding of the thermocompression bonding tape to the front surface or the back surface of the wafer.

7. The processing apparatus according to claim 5, wherein:
the camera is disposed in the upper chamber of the second tape pressure bonding unit, and whether the exposed surface of the wafer supported by the wafer table is the front surface or the back surface is detected before the tape-attached annular frame is conveyed.

8. The processing apparatus according to claim 7, wherein:
the camera is configured to detect whether or not the tape is properly pressure-bonded to the wafer, after the pressure bonding of the tape of the tape-attached annular frame to the wafer supported by the wafer table is executed.

9. The processing apparatus according to claim 1, wherein:
the frame table is configured to be raised and lowered;
the first pressure bonding roller is configured to execute pressure bonding of the tape to the annular frame while the frame is seated upon the frame table; and
the frame table is configured to be raised in the vertical direction while the first pressure bonding roller is moved in the horizontal direction such that an elevation angle α formed between the annular frame and the tape extending from the first pressure bonding roller towards a tape take-up part configured to take up the tape that has been used remains constant.

10. A processing apparatus comprising:
a wafer cassette table configured to have placed thereon a wafer cassette having multiple wafers housed therein;
a wafer carrying-out unit configured to carry a wafer out from the wafer cassette placed on the wafer cassette table;
a wafer table configured to support the wafer carried out by the wafer carrying-out unit;
a frame housing unit configured to house multiple annular frames therein, each annular frame having an opening part for housing the wafer therein;
a frame carrying-out unit configured to carry the annular frame out from the frame housing unit;
a frame table configured to support the annular frame carried out by the frame carrying-out unit;
a first tape pressure bonding unit that is disposed above the frame table and includes a first pressure bonding roller configured to execute pressure bonding of a tape to the annular frame;
a tape-attached frame conveying unit configured to convey, to the wafer table, the annular frame to which the tape is pressure-bonded, wherein the tape-attached frame conveying unit is also configured to place the tape-attached annular frame on the wafer table in such a manner that a front surface or a back surface of the wafer supported by the wafer table is positioned in the opening part of the annular frame;
a second tape pressure bonding unit that includes a second pressure bonding roller configured to execute pressure bonding of the tape of the tape-attached annular frame to the front surface or the back surface of the wafer;
frame unit carrying-out means configured to carry, out from the wafer table, a frame unit in which the tape of the tape-attached annular frame and the front surface or the back surface of the wafer are pressure-bonded together by the second tape pressure bonding unit; and
a frame cassette table configured to have placed thereon a frame cassette configured to house the frame unit therein;
wherein a first heating unit is disposed in one of or both the frame table and the first pressure bonding roller, and a second heating unit is disposed in one of or both the wafer table and the second pressure bonding roller, and
either an adhesive tape that has an adhesive layer laid on a sheet or a thermocompression bonding tape that does not have an adhesive layer on a sheet is selectively used as the tape, and
wherein the second tape pressure bonding unit includes:
an upper chamber disposed above the wafer table,
a lower chamber in which the wafer table is housed,
a raising-lowering mechanism configured to raise and lower the upper chamber and configured to generate a closed state in which the upper chamber is brought into contact with the lower chamber and an opened state in which the upper chamber is separated from the lower chamber,
a vacuum part configured to set the upper chamber and the lower chamber to a vacuum state in the closed state, and
an opening-to-atmosphere part configured to open the upper chamber and the lower chamber to atmosphere, and,
wherein in a state in which the tape of the tape-attached annular frame is positioned to the front surface or the back surface of the wafer supported by the wafer table, the upper chamber and the lower chamber are set to a vacuum state while the closed state is kept through actuating the raising-lowering mechanism, and pressure bonding of the tape of the tape-attached annular frame to the front surface or the back surface of the wafer is configured to be executed by the second pressure bonding roller disposed in the upper chamber, and wherein a camera is disposed in the upper chamber of the second tape pressure bonding unit, and whether an exposed surface of the wafer supported by the wafer table is the front surface or the back surface is detected before the tape-attached annular frame is conveyed.

11. The processing apparatus according to claim 10, wherein:

when the exposed surface of the wafer supported by the wafer table is the front surface, the camera is configured to acquire an identification displayed on the front surface of the wafer.

12. The processing apparatus according to claim 10, wherein:

the camera is configured to detect whether or not the tape is properly pressure-bonded to the wafer, after the pressure bonding of the tape of the tape-attached annular frame to the wafer supported by the wafer table is executed.

13. A processing apparatus comprising:

a wafer cassette table configured to have placed thereon a wafer cassette having multiple wafers housed therein;

a wafer carrying-out unit configured to carry a wafer out from the wafer cassette placed on the wafer cassette table;

a wafer table configured to support the wafer carried out by the wafer carrying-out unit;

a frame housing unit configured to house multiple annular frames therein, each annular frame having an opening part for housing the wafer therein;

a frame carrying-out unit configured to carry the annular frame out from the frame housing unit;

a frame table configured to support the annular frame carried out by the frame carrying-out unit;

a first tape pressure bonding unit that is disposed above the frame table and includes a first pressure bonding roller configured to execute pressure bonding of a tape to the annular frame;

a tape-attached frame conveying unit configured to convey, to the wafer table, the annular frame to which the tape is pressure-bonded, wherein the tape-attached frame conveying unit is also configured to place the tape-attached annular frame on the wafer table in such a manner that a front surface or a back surface of the wafer supported by the wafer table is positioned in the opening part of the annular frame;

a second tape pressure bonding unit that includes a second pressure bonding roller configured to execute pressure bonding of the tape of the tape-attached annular frame to the front surface or the back surface of the wafer;

frame unit carrying-out means configured to carry, out from the wafer table, a frame unit in which the tape of the tape-attached annular frame and the front surface or the back surface of the wafer are pressure-bonded together by the second tape pressure bonding unit; and a frame cassette table configured to have placed thereon a frame cassette configured to house the frame unit therein;

wherein a first heating unit is disposed in one of or both the frame table and the first pressure bonding roller, and a second heating unit is disposed in one of or both the wafer table and the second pressure bonding roller, and either an adhesive tape that has an adhesive layer laid on a sheet or a thermocompression bonding tape that does not have an adhesive layer on a sheet is selectively used as the tape, wherein a ring-shaped reinforcing part having a protrusion shape is formed in a region on the back surface corresponding to an outer circumferential surplus region of the wafer, and the processing apparatus further comprises:

a reinforcing part removing unit configured to cut and remove the ring-shaped reinforcing part from the wafer of the frame unit carried out by the frame unit carrying-out means, and ring-free unit carrying-out means configured to carry a ring-free unit resulting from the removal of the ring-shaped reinforcing part out from the reinforcing part removing unit, and wherein the reinforcing part removing unit further includes a separating part that is configured to separate the ring-shaped reinforcing part from the remainder of the wafer via a plurality tops that each have a wedge shape and that are configured and arranged to be brought into contact with an outer peripheral surface of the reinforcing part.

14. The processing apparatus according to claim 13, wherein:

a ring-shaped reinforcing part having a protrusion shape is formed in a region on the back surface corresponding to an outer circumferential surplus region of the wafer, and the processing apparatus further comprises:

a reinforcing part removing unit configured to cut and remove the ring-shaped reinforcing part from the wafer of the frame unit carried out by the frame unit carrying-out means, and ring-free unit carrying-out means configured to carry a ring-free unit resulting from the removal of the ring-shaped reinforcing part out from the reinforcing part removing unit.

* * * * *

UNITED STATES PATENT AND TRADEMARK OFFICE
CERTIFICATE OF CORRECTION

PATENT NO. : 12,417,938 B2
APPLICATION NO. : 18/047445
DATED : September 16, 2025
INVENTOR(S) : Takashi Mori et al.

Page 1 of 1

It is certified that error appears in the above-identified patent and that said Letters Patent is hereby corrected as shown below:

In the Claims

Column 32, Claim 1, Line 15, delete "roller"

Signed and Sealed this
Twentieth Day of January, 2026

John A. Squires
*Director of the United States Patent and Trademark Office*